(12) United States Patent
Chalker et al.

(10) Patent No.: US 8,613,975 B2
(45) Date of Patent: Dec. 24, 2013

(54) METHODS OF PRODUCING HIGH-K DIELECTRIC FILMS USING CERIUM-BASED PRECURSORS

(75) Inventors: Paul Raymond Chalker, Wirral (GB); Peter Nicholas Heys, Cheshire (GB)

(73) Assignee: Sigma-Aldrich Co. LLC, St. Louis, MO (US)

( * ) Notice: Subject to any disclaimer, the term of this patent is extended or adjusted under 35 U.S.C. 154(b) by 231 days.

(21) Appl. No.: 12/992,936

(22) PCT Filed: May 22, 2009

(86) PCT No.: PCT/US2009/045032
§ 371 (c)(1), (2), (4) Date: Mar. 22, 2011

(87) PCT Pub. No.: WO2009/143456
PCT Pub. Date: Nov. 26, 2009

(65) Prior Publication Data
US 2011/0165401 A1 Jul. 7, 2011

Related U.S. Application Data

(60) Provisional application No. 61/055,594, filed on May 23, 2008, provisional application No. 61/105,594, filed on Oct. 15, 2008.

(51) Int. Cl.
*C23C 16/40* (2006.01)

(52) U.S. Cl.
USPC .................................. 427/255.31; 427/255.36

(58) Field of Classification Search
USPC ............................ 427/255.31, 255.35, 255.36
See application file for complete search history.

(56) References Cited

U.S. PATENT DOCUMENTS

| | | | |
|---|---|---|---|
| 4,511,515 A * | 4/1985 | Thompson | 534/15 |
| 5,625,587 A | 4/1997 | Peng et al. | 365/145 |
| 5,866,204 A | 2/1999 | Robbie et al. | 427/256 |
| 6,080,283 A | 6/2000 | Ray | 204/164 |
| 6,099,903 A | 8/2000 | Kaloyeros et al. | 427/250 |
| 6,248,605 B1 | 6/2001 | Härkönen et al. | 438/29 |
| 6,255,121 B1 | 7/2001 | Arita et al. | 438/3 |
| 6,258,157 B1 * | 7/2001 | Gordon | 106/287.24 |
| 6,297,539 B1 * | 10/2001 | Ma et al. | 257/410 |
| 6,430,458 B1 | 8/2002 | Mosely et al. | 700/121 |
| 6,599,447 B2 | 7/2003 | Stauf et al. | 252/520.21 |
| 6,698,728 B1 | 3/2004 | Ravetz et al. | 261/121.1 |
| 6,846,743 B2 | 1/2005 | Endo et al. | 438/681 |
| 6,852,167 B2 | 2/2005 | Ahn | 118/715 |
| 6,858,546 B2 | 2/2005 | Niinisto et al. | 438/785 |
| 7,108,747 B1 | 9/2006 | Leskeia et al. | 117/86 |
| 7,282,119 B2 | 10/2007 | Odedra et al. | 203/29 |
| 7,419,698 B2 | 9/2008 | Jones | 427/248.1 |
| 7,557,229 B2 | 7/2009 | Gordon et al. | 556/137 |
| 7,736,446 B2 | 6/2010 | Takashima et al. | 148/284 |
| 8,039,062 B2 | 10/2011 | Heys et al. | 427/585 |
| 2002/0172768 A1 | 11/2002 | Endo et al. | 427/255.28 |
| 2002/0176927 A1 * | 11/2002 | Kodas et al. | 427/8 |
| 2003/0072882 A1 * | 4/2003 | Niinisto et al. | 427/255.28 |
| 2003/0124871 A1 * | 7/2003 | Arghavani et al. | 438/763 |
| 2004/0026374 A1 * | 2/2004 | Nguyen et al. | 216/89 |
| 2004/0033650 A1 | 2/2004 | Sandhu et al. | 438/200 |
| 2004/0043635 A1 | 3/2004 | Vaartstra | 438/785 |
| 2004/0075130 A1 | 4/2004 | Nam et al. | 257/306 |
| 2004/0197475 A1 * | 10/2004 | Stadel et al. | 427/255.31 |
| 2005/0112874 A1 | 5/2005 | Skarp et al. | 438/680 |
| 2005/0271813 A1 | 12/2005 | Kher et al. | 427/248.1 |
| 2006/0040445 A1 | 2/2006 | Lee et al. | 438/250 |
| 2006/0177975 A1 * | 8/2006 | Ahn et al. | 438/197 |
| 2006/0252279 A1 | 11/2006 | Vaartstra | 438/785 |
| 2007/0190684 A1 | 8/2007 | Jones | 427/258.32 |
| 2007/0259110 A1 * | 11/2007 | Mahajani et al. | 427/248.1 |
| 2008/0176375 A1 * | 7/2008 | Erben et al. | 438/386 |
| 2008/0251016 A1 | 10/2008 | Cunning et al. | 118/722 |
| 2008/0282970 A1 | 11/2008 | Heys et al. | 117/104 |
| 2009/0035464 A1 | 2/2009 | Sato et al. | 427/255.28 |
| 2009/0074983 A1 | 3/2009 | Heys et al. | 427/569 |
| 2010/0019357 A1 | 1/2010 | Toriumi et al. | 257/635 |
| 2010/0256406 A1 | 10/2010 | Kanjolia et al. | 556/136 |
| 2010/0261350 A1 | 10/2010 | Kanjolia et al. | 438/661 |
| 2011/0021803 A1 | 1/2011 | Jin et al. | 558/150 |

(Continued)

FOREIGN PATENT DOCUMENTS

| | | | | |
|---|---|---|---|---|
| DE | 11 2005 000134 | | 2/2007 | ........... C07C 215/08 |
| EP | 0103447 | * | 9/1983 | |

(Continued)

OTHER PUBLICATIONS

Mardare et al. J. Optoelectronics and Advanced Materials, vol. 6, No. 1, Mar. 2004, p. 333-336.*

Chalker, P.R., et al., "Permittivity enhancement of hafnium dioxide high-k films by cerium doping". Applied Physics Letters, 93, 182911 (2008), pp. 1-3.*

Wang, S.Y., et al., "Raman spectroscopy studies of Ce-doping effects on Ba0.5Sr0.5TiO3 thin films". Journal of Applied Physics 99, 013504 (2006), pp. 1-6.*

Anwander, R. et al., (1997) "Volatile donor-functionalized alkoxy derivatives of lutetium and their structural characterization," Inorg. Chem., 36:3545-3552.

(Continued)

*Primary Examiner* — Bret Chen
(74) *Attorney, Agent, or Firm* — Harness, Dickey & Pierce, P.L.C.

(57) ABSTRACT

Methods are provided to form and stabilize high-κ dielectric films by chemical phase deposition processes using metal-source precursors and cerium-based β-diketonate precursors according to Formula I: Ce(L)x (Formula I) wherein: L is a β-diketonate; and x is 3 or 4. Further provided are methods of improving high-κ gate property of semiconductor devices by using cerium precursors according to Formula I. High-κ dielectric films are also provided comprising hafnium oxide, titanium oxide or mixtures thereof, and further containing a permittivity maintaining or increasing amount of cerium atoms.

35 Claims, 31 Drawing Sheets

(56) References Cited

U.S. PATENT DOCUMENTS

| | | | |
|---|---|---|---|
| 2011/0151227 A1 | 6/2011 | Chalker et al. | 428/220 |
| 2011/0165780 A1 | 7/2011 | Kanjolia et al. | 438/785 |
| 2011/0174416 A1 | 7/2011 | Hubsch et al. | 141/1 |
| 2011/0184156 A1 | 7/2011 | Jones | 534/15 |
| 2012/0177845 A1 | 7/2012 | Odedra et al. | 427/569 |
| 2012/0178266 A1 | 7/2012 | Heys et al. | 438/785 |
| 2012/0270409 A1* | 10/2012 | Kim et al. | 438/763 |
| 2013/0041170 A1 | 2/2013 | Odedra et al. | 566/46 |
| 2013/0052368 A1 | 2/2013 | Rushworth et al. | 427/569 |

FOREIGN PATENT DOCUMENTS

| | | | |
|---|---|---|---|
| EP | 0 563 557 | 2/1993 | C07C 215/44 |
| EP | 0973189 * | 7/1999 | |
| JP | 07-315847 | 12/1995 | C07C 31/28 |
| JP | 08-217461 | 8/1996 | C01G 55/00 |
| JP | 02-363122 | 12/2002 | C07C 43/13 |
| JP | 2004-168641 * | 6/2004 | |
| JP | 2005-179777 | 7/2005 | C23C 16/40 |
| JP | 2006-060234 | 9/2006 | |
| JP | 2006-521367 | 9/2006 | C07C 43/13 |
| JP | 2007-073726 | 3/2007 | H01L 29/78 |
| JP | 2008-502805 | 1/2008 | C23C 16/42 |
| TW | 446754 | 1/2001 | |
| TW | 518368 | 1/2003 | |
| TW | 200540291 | 12/2005 | C23C 16/34 |
| TW | 200540291 | 12/2006 | C23C 16/34 |
| WO | WO 2002/020864 | 3/2002 | C23C 14/56 |
| WO | WO 2002/027063 | 4/2002 | C23C 16/40 |
| WO | WO 02/45128 | 6/2002 | |
| WO | WO 02/079211 | 10/2002 | C07F 7/00 |
| WO | WO 2003/004721 | 1/2003 | C07F 7/00 |
| WO | WO 2003/035926 | 5/2003 | C07F 5/00 |
| WO | WO 2004/010469 | 1/2004 | H01L 21/285 |
| WO | WO 2006/025350 | 3/2006 | H01L 21/316 |
| WO | WO 2006/131751 | 12/2006 | C23C 16/18 |
| WO | WO 2007/057631 | 5/2007 | C23C 16/448 |
| WO | WO 2009/015270 | 1/2009 | C07F 15/00 |
| WO | WO 2009/015271 | 1/2009 | C07F 15/00 |
| WO | WO 2009/036045 | 3/2009 | C23C 16/455 |
| WO | WO 2009/036046 | 3/2009 | C23C 16/455 |
| WO | WO 2009/086263 | 7/2009 | C23C 16/40 |
| WO | WO 2009/117583 | 9/2009 | C07F 9/09 |
| WO | WO 2009/143452 | 11/2009 | C23C 16/40 |
| WO | WO 2009/143456 | 11/2009 | C23C 6/455 |
| WO | WO 2009/143458 | 11/2009 | C23C 16/40 |
| WO | WO 2009/143460 | 11/2009 | C23C 16/40 |
| WO | WO 2009/146423 | 12/2009 | C23C 16/16 |
| WO | WO 2009/155507 | 12/2009 | C23C 16/18 |
| WO | WO 2009/155520 | 12/2009 | C23C 16/18 |
| WO | WO 2011/011299 | 1/2011 | C23C 16/40 |
| WO | WO 2011/017068 | 2/2011 | C07F 15/06 |
| WO | WO 2011/053505 | 5/2011 | C23C 16/448 |
| WO | WO 2011/097100 | 8/2011 | B01B 1/00 |
| WO | WO 2011/112413 | 9/2011 | C23C 16/00 |
| WO | WO 2011/115878 | 9/2011 | C23C 16/18 |
| WO | WO 2012/027575 | 3/2012 | C07F 11/00 |

OTHER PUBLICATIONS

Aspinall, H. (2003) "Growth of praseodymium oxide thin films by liquid injection of MOCVD using a novel praseodymiu alkoxide precursor" Chemical Vapor Deposition, 9:235-238.

Chalker, P., et al., (2008) "Permittivity Enhancement of Hafnium Dioxide High-κ Films by Cerium Doping", Applied Physics Letters, 93:182911.

Felten, et al., (1997) "Deposition of $Ta_2O_s/SiO_2$ Multilayer Films by a New Process Injection MOCVD", Thin Solid Films, 295:79-81.

Fisher, D. and Kersch, A. (2008) "The Effect of Dopants on the Dielectric Constant of $HFO_2$ and $ZrO_2$", Applied Physics Letters, 92:012908.

Gaskell, J.M., et al. (2007) "Deposition of Lanthanum Zirconium Oxide High-κ Films by Liquid Injection ALD and MOCVD", Chemical Vapor Deposition. 13:684-690.

Govindarajan, S., et al. (2007) "Higher Permittivity Rare Earth Dope $HfO_2$ for Sub-45-nm Metal Insulator Semiconductor Devices", Applied Physics Letters, 91:062906.

Great Britain Search Report for Application No. GB0405441.7 dated Jul. 5, 2004.

Herrmann, et al. (1992) "Volatile neodymium and yttrium alkoxides with new bulky chelating ligands", Chemical Reports, 125(11):2399-2405.

Herrmann, et al. (1995) "Volatile metal alkoxides according to the concept of donor functionalization," Angewandte Chemie International Edition English, 34:2187-2206.

Jones, A., et al. (2004) "Some recent developments in the MOCVD and ALD of High-κ dielectric oxides", J. Materials Chemistry, 14:3101-3112.

Malandrino, G., et al. (2003) "Nanostructured cerium dioxide thin films by MOCVD: influence of the substrate nature and processing parameters," Electrochemical Society Proceedindgs, 2003-08:1112-1118.

Nigro, R., et al. (2003) "MOCVD growth of $Pr_2O$ high-κ gate dielectric for Silicon: synthesis and structural investigation", Electrochemical Society Proceedings, 2003-08: 915-922.

Päiväsaari, J, et. al, (2002) "Cerium Dioxide Buffer Layers at Low Temperature by Atomic Layer Deposition", J. Mater. Chem., 12:1828-1832.

Scott, H.G. (1975) "Phase Relationships in the Zirconia-Yttria System", J. Mat. Science, 10:1527-1535.

Song, H., et al. (2003) "Synthesis and characterization of volatile metal β-diketonates chelates of M(DPM)$_n$ (M=Ce, Gd, Y. Zr, n=3,4) used as precursors of MOCVD", Journal of Crystal Growth, 250:423-430.

Wandass, et al. (1990) "Application of sol-gel techniques to thin-film superconductor systems" AIP Conference Proceedings, 200:157-164.

Wright, P.J., et al. (2002) "Metal organic chemical vapor deposition (MOCVD) of oxides and ferroelectric materials " J. Material Science: Materials in Electronics, 13: 671-678.

Yashima, M., et al. (1990) Abstract presented at the 108th Annual Meeting of the Japan Institute of Metals, Apr. 2-4, 1991 (Paper No. 508).

International Search Report for PCT/GB2004/001047 dated Oct. 11, 2004,

International Search Report for PCT/US2009/045032 dated Aug. 27, 2009.

International Search Report for PCT/US2009/045039 dated Aug. 25, 2009.

Office Action dated Aug. 3, 2010 issued in U.S. Appl. No. 10/548,946.

International Search Report dated Apr. 10, 2012 for Singapore Application No. 201008622-1.

Triyoso, D., et al. (2006) "Characteristics of mixed oxides and nanolaminates of atomic layer deposited $HfO_2$-$TiO_2$ gate dielectrics", Journal of the Electrochemical Society, 153(9):G834-G839.

International Preliminary Report of Patentability for PCT/US2009/045032 dated Nov. 23, 2010.

International Preliminary Report on Patentability for PCT/US2009/045039 dated Nov. 23, 2010.

Singapore Search Report and Written Opinion for Application No 201008563-7 dated Jul. 19, 2010.

Singapore Search Report and Written Opinion for Application No. 201008622-1 dated Feb. 13, 2012.

Chinese Office Action for Application No. 200980126702.6 dated Jul. 4, 2012.

Chinese Office Action for Application No. 200980123701.1 dated May 2, 2012.

Aspinall, H., (2006) "Requirements of precursor4s for MOCVD and ALD of rare earth oxides" Rare Earth Oxide Thin Films, 53-72.

Tcheliebou, F., et al. (1996) "Electrical behavior of this $ZrO_2$ films containing some ceramic oxides" Materials Science and Engineering, B38:90-95.

(56) References Cited

OTHER PUBLICATIONS

Office Action for U.S. Appl. No. 12/992,942 dated Mar. 4, 2013.
International Search Report for PCT/US2009/045024 dated Jul. 16, 2009.
Corrected Examiner's Search Report and Written Opinion for Singapore Application No. 201008563-7 dated Jan. 21, 2013.
Chinese Office Action for Application No. 200980123702.6 dated Mar. 13, 2013.
Japanese Office Action for Application No. 2011-520731 dated Jan. 4, 2013.
Office Action for Japanese Application No. 2011-510731 dated Jun. 4, 2013.

\* cited by examiner

METHODS OF PRODUCING HIGH-κ DIELECTRIC FILMS USING CERIUM-BASED PRECURSORS

CROSS-REFERENCE TO RELATED APPLICATIONS

This patent claims the benefit of U.S. provisional application Ser. No. 61/055,594, filed on 23 May 2008, and U.S. provisional application Ser. No. 61/105,594, filed on 15 Oct. 2008. The disclosure of each above-referenced application is incorporated herein by reference in its entirety. Further, disclosure of copending U.S. provisional application Ser. No. 61/055,620, filed on 23 May 2008; copending U.S. provisional application Ser. No. 61/055,646, filed on 23 May 2008; and copending U.S. provisional application Ser. No. 61/055,695, filed on 23 May 2008, are each incorporated herein by reference in their entirety without admission that such disclosures constitute prior art to the present invention.

FIELD OF THE INVENTION

The present invention relates to methods of forming high-κ dielectric thin metallic films, improving such films, and a lattice capable of forming such films.

BACKGROUND OF THE INVENTION

Various organometallic precursors are used to form high-κ dielectric thin metal films for use in the semiconductor industry. Various deposition processes are used to form the metal films, such as chemical vapor deposition ("CVD") or atomic layer deposition ("ALD"), also known at atomic layer epitaxy.

CVD is a chemical process whereby precursors are deposited on a substrate to form a solid thin film. In a typical CVD process, the precursors are passed over a substrate (wafer) within a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects and time.

ALD is a chemical process which separates the precursors during the reaction. The first precursor is passed over the substrate producing a monolayer on the substrate. Any excess unreacted precursor is pumped out of the reaction chamber. A second precursor is then passed over the substrate and reacts with the first precursor, forming a second monolayer of film over the first-formed film on the substrate surface. This cycle is repeated to create a film of desired thickness. ALD film growth is self-limited and based on surface reactions, creating uniform depositions that can be controlled at the nanometer-thickness scale.

Govindarajan, S., et al. reports rare earth doping (Ge, Er, Dy) of $HfO_2$. Hf, Zr and rare earth dopant were deposited with physical vapor deposition. ["Higher permittivity rare earth doped $HfO_2$ for sub-45-nm metal insulator-semiconductor devices," *Applied Physics Letters*. 2007. 91:062906]

Yashima M., et. al. report zirconia-ceria solid solutions and lattice in an abstract presented at the Fall Meeting of the Ceramic Society of Japan, Kanazawa, Japan, Sep. 26-28, 1990 (Paper No. 6-3A07), and at the 108th Annual Meeting of the Japan Institute of Metals, Tokyo, Japan, Apr. 2-4, 1991 (Paper No. 508).

Scott, H. G. reports metastable and equilibrium phase relationships in zirconia-yttria system. ["Phase Relationships in the zirconia-yttria system," *J. Mat. Science*. 1975. 10:1527-1535].

International Publication No. WO 02/27063 reports vapor deposition processes using metal oxides, silicates and phosphates, and silicon dioxide.

Zirconia, hafnia and $TiO_2$ have been used to create dielectric films, generally to replace silicon dioxide gates for use in the semiconductor industry. Replacing silicon dioxide with a high-κ dielectric material allows increased gate capacitance without concomitant leakage effects.

Therefore, methods are needed to create and improve high-κ dielectric films by either increasing the dielectric constant, or stabilizing the film to maintain a high dielectric constant, or both.

SUMMARY OF THE INVENTION

There is now provided a method to form a high-κ dielectric film by a chemical phase deposition process. The method comprises delivering at least one metal-source precursor and at least one cerium precursor to a substrate, wherein the at least one cerium precursor corresponds in structure to Formula I:

$$Ce(L)_x \qquad \text{(Formula I)}$$

wherein:
L is a β-diketonate; and
x is 3 or 4.

There is further provided a method to improve high-κ gate property of a semiconductor device. The method comprises using at least one cerium precursor to form a high-κ dielectric film for use in the semiconductor device, wherein the at least one cerium precursor corresponds in structure to Formula I.

There is further provided a method to stabilize a high-κ dielectric material. The method comprises adding at least one cerium precursor to the high-κ dielectric material, wherein the at least one cerium precursor corresponds in structure to Formula I.

There is further provided a high-κ dielectric film comprising hafnium oxide, titanium oxide or mixtures thereof, and further containing a permittivity maintaining or increasing amount of cerium atoms.

Other embodiments, including particular aspects of the embodiments summarized above, will be evident from the detailed description that follows.

DETAILED DESCRIPTION OF THE INVENTION

Figure 1:
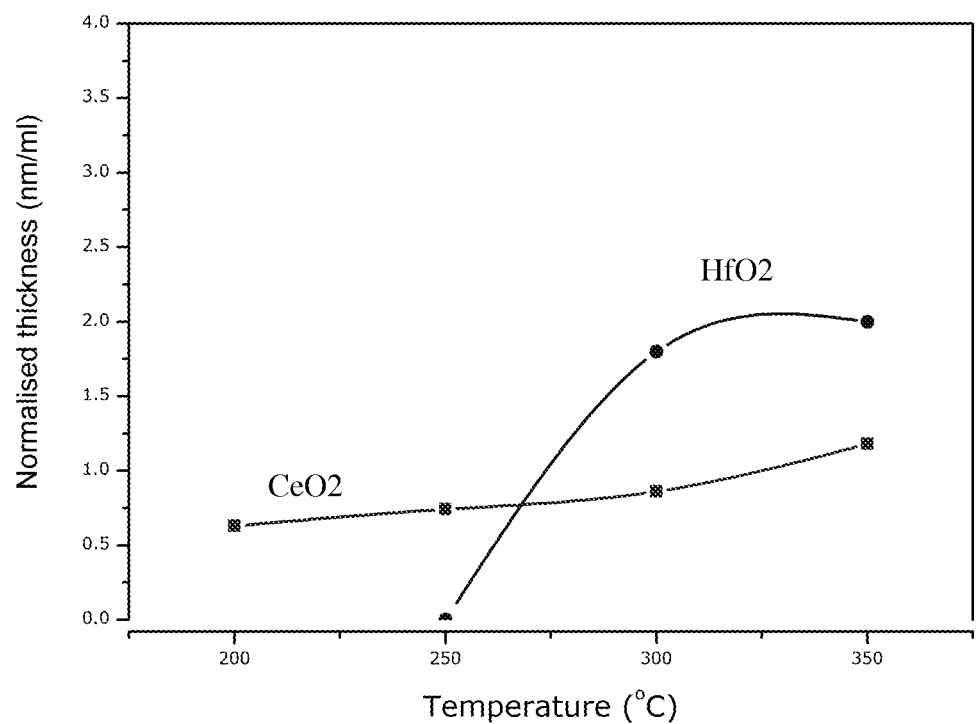
FIG. 1 is a graphical representation of cerium oxide ($CeO_2$) versus hafnium oxide ($HfO_2$) growth rate.

In various aspects of the invention, methods are provided that utilize cerium (III) and/or cerium (IV) precursors as dopants to form high-κ dielectric thin films. The methods of the invention are used to create or grow thin films with an improved high-κ gate property, and thus are able to maintain high dielectric constants. In other aspects of the invention a lattice is provided capable of forming a high-κ gate film.

Although not admitted to be prior art, a publication reports effects of Si, C, Ti, Ce, Sn and Ge doping on the dielectric constant of $HfO_2$ and $ZrO_2$. [Fischer D. and Kersch A. "The effect of dopants on the dielectric constant of $HfO_2$ and $ZrO_2$ from first principles," *Applied Physics Letters*. 2008. 92:012908.]

As used herein, the term "high-κ dielectric" refers to a material, such as a metal-containing film, with a higher dielectric constant (κ) when compared to silicon dioxide (which has a dielectric constant of about 3.7). Typically, a high-κ dielectric film is used in semiconductor manufacturing processes to replace the silicon dioxide gate dielectric. A high-κ dielectric film may be referred to as having a "high-κ gate property" when the dielectric film is used as a gate material and has at least a higher dielectric constant than silicon dioxide. Preferably the dielectric film has a dielectric constant of at least about 20, preferably at least about 25, and more preferably at least about 40.

As used herein, the term "relative permittivity" is synonymous with dielectric constant (κ).

As used herein, the term "chemical phase deposition process" is used to refer to any type of chemical phase deposition technique such as CVD or ALD, as opposed to physical vapor deposition, e.g. sputtering. In various embodiments of the invention, CVD may take the form of liquid injection CVD. In other embodiments, ALD may be either photo-assisted ALD or liquid injection ALD.

As used herein, the term "precursor" refers to an organometallic molecule, complex and/or compound which is deposited or delivered to a substrate to form a thin film by a vapor deposition process such as CVD or ALD.

As used herein, the term "alkyl" refers to a saturated hydrocarbon chain of 1 to 10 carbon atoms in length, such as, but not limited to, methyl, ethyl, propyl and butyl. The alkyl group may be straight-chain or branched-chain. For example, as used herein, propyl encompasses both n-propyl and isopropyl; butyl encompasses n-butyl, sec-butyl, iso-butyl and tert-butyl.

As used herein, the term "β-diketonate" refers to a compound or complex containing the following moiety:

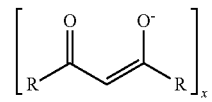

or an acid thereof, wherein R is an alkyl group and x is the number of β-diketonate moieties attached to, typically, a metal center, through the oxygen atoms. For example, 2,2,6,6-tetramethyl-3,5-heptanedionate (also known as THD) is a β-diketonate depicted as:

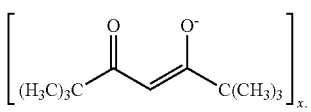

In a first embodiment, a method to form a high-κ dielectric film by a film deposition process is provided. The method comprises delivering at least one metal-source precursor and at least one cerium precursor to a substrate to form a cerium-metal containing film, particularly a cerium-hafnium containing film and/or a cerium-zirconium containing film and/or a cerium-titanium containing film. The film deposition process may be any deposition process such as chemical phase deposition processes (e.g. CVD or ALD), or physical deposition processes (e.g. sputtering).

In a particular embodiment, a method to form a high-κ dielectric film by a chemical phase deposition process is provided. The method comprises delivering at least one metal-source precursor and at least one cerium precursor to a substrate, wherein the at least one cerium precursor corresponds in structure to Formula I:

$$Ce(L)_x \qquad \text{(Formula I)}$$

wherein:
L is a β-diketonate; and
x is 3 or 4.

In one embodiment L is a β-diketonate such as 2,2,6,6-tetramethyl-3,5-heptanedionate, pentane-2,4-dionate, 1,1,1-trifluoro-2,4-dionate, 1,1,1,5,5,5-hexafluoropentane-2,4-dionate, hexafluoroisopropoxide, 2-dimethylaminoethanolate, 2-methoxyethanolate or 1-methoxy-2-methyl-2-propanolate. In a particular embodiment L is a β-diketonate and x is 4, therefore in this embodiment there are four β-diketonates attached to cerium. In further particular embodiment, the β-diketonate is 2,2,6,6-tetramethyl-3,5-heptanedionate (also known as THD).

Any metal-source precursor suitable for forming a film may be used according to the invention. In a particular embodiment, the at least one metal-source precursor is compatible with the at least one cerium precursor. For example, without limitation, the at least one metal-source precursor may be compatible with the at least one cerium precursor for purposes of depositing a metal oxide film with the composition $Ce_xM_{1-x}O_y$ where M is either Hf, Zr or Ti; x has a value between about zero and about 0.5; and y has a value of equal to or less than about 2.

Examples of the at least one metal-source precursor include, without limitation:
a metal amide, such as Hafnium dimethylamide, Zirconium dimethylamide, Titanium dimethylamide, Hafnium ethylmethylamide, Zirconium ethylmethylamide, Titanium ethylmethylamide, Hafnium diethylamide, Zirconium diethylamide and Titanium diethylamide;
a metal alkoxide, such as Hafnium t-butoxide, Zirconium t-butoxide, Titanium t-butoxide, Hafnium i-propoxide, Zirconium i-propoxide, Titanium i-propoxide, Hafnium bis t-butoxy bis 2-methyl-2-methoxy propoxide, Zirconium bis t-butoxy bis 2-methyl-2-methoxy propoxide, Titanium bis t-butoxy bis 2-methyl-2-methoxy propoxide, Zirconium bis i-propoxy bis 2-methyl-2-methoxy propoxide, Titanium bis i-propoxy bis 2-methyl-2-methoxy propoxide, Hafnium 2-methyl-2-methoxy propoxide, Zirconium 2-methyl-2-methoxy propoxide and Titanium 2-methyl-2-methoxy propoxide;
a metal β-diketonate (not $Ce(THD)_4$), such as Hafnium 2,2,6,6-tetramethyl-3,5-heptanedionate, Zirconium 2,2,6,6-tetramethyl-3,5-heptanedionate, Titanium 2,2,6,6-tetramethyl-3,5-heptanedionate, Zirconium bis i-propoxy bis 2,2,6,6-tetramethyl-3,5-heptanedionate and Titanium bis i-propoxy 2,2,6,6-tetramethyl-3,5-heptanedionate;
a metal cyclopentadienyl, such as bis methylcyclopentadienyl Hafnium dimethyl, bis methylcyclopentadienyl Zirconium dimethyl, bis methylcyclopentadienyl Hafnium methyl methoxide, bis methylcyclopentadienyl Zirconium methyl methoxide, methylcyclopentadienyl Hafnium tris dimethylamide, methylcyclopentadienyl Zirconium tris dimethylamide and methylcyclopentadienyl Titanium tris dimethylamide.

Therefore, in one embodiment, the high-κ dielectric film formed by a method of the invention may comprise:
(1) hafnium oxide and cerium,
(2) zirconium oxide and cerium,
(3) titanium oxide and cerium, or
(4) mixtures of hafnium, zirconium and/or titanium oxide and cerium.

In a particular embodiment, at least one cerium precursor is used in a vapor deposition process with at least one hafnium precursor to create a cerium doped hafnium oxide film.

In another particular embodiment, at least one cerium precursor is used in a vapor deposition process with at least one zirconium precursor to create a cerium-doped zirconium oxide film.

In another particular embodiment, at least one cerium precursor is used in a vapor deposition process with at least one titanium precursor to create a cerium-doped titanium oxide film.

In another particular embodiment, at least one cerium precursor is used in a vapor deposition process with at least one hafnium precursor, zirconium precursor and/or titanium precursor to create a cerium-doped "mixed" metal oxide film. Therefore, a "mixed" metal oxide film, as used herein, refers to a metal oxide film comprising cerium and one or more of the following: hafnium oxide, zirconium oxide and titanium oxide.

In one embodiment, the method of the invention creates either hafnium oxide, zirconium oxide, titanium oxide or a mixed metal oxide dielectric film that contains from about 0.5 to about 35 atomic metal % cerium. In a particular embodiment the metal oxide or mixed metal oxide film contains from about 5 to about 20 atomic metal % cerium. In a further particular embodiment, the metal oxide or mixed metal oxide film contains from about 8 to about 12 atomic metal % cerium.

In one embodiment, the at least one metal source precursor and/or the at least one cerium precursor may be dissolved in an appropriate hydrocarbon or amine solvent. Appropriate hydrocarbon solvents include, but are not limited to aliphatic hydrocarbons, such as hexane, heptane and nonane; aromatic hydrocarbons, such as toluene and xylene; aliphatic and cyclic ethers, such as diglyme, triglyme and tetraglyme. Examples of appropriate amine solvents include, without limitation, octylamine and N,N-dimethyldodecylamine. For example, a precursor may be dissolved in toluene to yield a 0.05 to 1M solution.

In a particular embodiment, the at least one cerium precursor is dissolved in an organic solvent, such as toluene, heptane, octane, nonane or tetrahydrofuran (THF).

The cerium-doped films of the invention can be formed by chemical vapor deposition. In a particular embodiment, the chemical vapor deposition is liquid injection chemical vapor deposition.

Alternatively, the cerium-doped films of the invention can be formed by atomic layer deposition. In a particular embodiment, the atomic layer deposition is photo-assisted atomic layer deposition. And in another particular embodiment, the atomic layer deposition is liquid injection atomic layer deposition.

In one embodiment of the invention, each precursor is deposited and/or delivered onto a substrate in pulses alternating with pulses of an oxygen source. Any suitable oxygen source may be used, for example, $H_2O$, $O_2$ or ozone.

In a particular embodiment, each precursor is deposited onto a substrate in pulses with a continuous supply of the oxygen source such as $H_2O$, $O_2$ or ozone.

In one embodiment of the invention, the cerium doped high-κ dielectric film has a relative permittivity of about 20 to about 100, particularly from about 40 to about 70. Further, the high-κ dielectric film is capable of maintaining a relative permittivity of about 20 to about 100 at frequencies of about 1 KHz to about 1 GHz.

A variety of substrates can be used in the methods of the present invention. For example, the precursors according to Formula I may be deposited on substrates such as, but not limited to, silicon, silicon oxide, silicon nitride, tantalum, tantalum nitride, or copper.

In another embodiment of the invention, a method is provided to improve the high-κ gate property of a semiconductor device. The method comprises using at least one cerium precursor to form a high-κ dielectric film for use in the semiconductor device, wherein the at least one cerium precursor corresponds in structure to Formula I above.

Including at least one cerium precursor according to Formula I in a metal oxide film improves the high-κ gate property by either increasing the dielectric constant, allowing longer maintenance of a high dielectric constant or both, when compared to the particular metal oxide film without the at least one cerium precursor. This improves the high-κ gate property of the semiconductor device by increasing gate capacitance and improving permittivity for faster transistors and smaller devices.

For example, the dielectric constant can be increased about 20 to about 50 units by using at least one cerium precursor according to Formula I; or a high dielectric constant can be maintained at about 1 KHz to about 1 GHz, when compared to not using at least one cerium precursor according to Formula I.

In another embodiment of the invention, a method is provided to stabilize a high-κ dielectric material. The method comprises adding at least one cerium precursor to the high-κ dielectric material wherein the at least one cerium precursor corresponds in structure to Formula I above. The term "stabilize" refers generally to altering the high-κ dielectric material such that the high-κ dielectric material is able to maintain a high dielectric constant at frequencies of about 1 KHz to about 1 GHz.

Therefore, in one embodiment of the invention, the cerium-doped high-κ dielectric film has a relative permittivity of about 20 to about 100, particularly from about 40 to about 70. Further, the high-κ dielectric film is capable of maintaining a relative permittivity of about 20 to about 100 at frequencies of about 1 KHz to about 1 GHz.

The high-κ dielectric material may be any material wherein stabilization is needed to improve or maintain a high dielectric constant. For example, the high-κ dielectric material may be provided by a film composed of one or more of hafnium oxide, zirconium oxide, titanium oxide or a "mixed" metal oxide, for example, a hafnium, zirconium and/or titanium oxide mixture. Additionally, if three metals are present, then a "ternary" mixed metal oxide film can be stabilized.

Without being bound by theory, it is believed that doping hafnium, zirconium, or titanium with a +3-oxidation-state rare earth element causes or permits 'dielectric relaxation' in the film-forming materials or film thereby formed. High frequencies cause the dielectric constant (or relative permittivity) of the material to decrease, which is known as dielectric relaxation. It is hypothesized that dielectric relaxation occurs because substitution of hafnium, zirconium or titanium with the +3 element in the lattice causes an oxygen vacancy in order to maintain balanced charge. In order to improve the dielectric constant and/or maintain the dielectric constant at high frequencies, a hafnium oxide, zirconium oxide, titanium oxide or mixed oxide film can be created using a precursor as disclosed herein such that cerium (IV) is incorporated into the lattice.

Thus in one embodiment of the invention, the high-κ dielectric material is stabilized by stabilizing the metastable phase of the metal used. For example, and without being bound by theory, pure zirconium oxide and hafnium oxide exhibit a stable monoclinic crystalline phase with dielectric constant typically in the range of about 18 to about 22. The metastable phases, such as tetragonal and cubic crystal structures of these materials, have high permittivities. Therefore, it is hypothesized that in order to stabilize the metastable phases, some of the Group IV metal may be replaced with one or more cerium precursors of Formula I which can adopt a +4 charge and may obviate the formation of charged oxygen ion vacancies.

Further, the use of cerium precursor(s) to stabilize different phases also has implications for radiation hardness, as the resistance to radiation can be increased which is very useful for space applications where resistance to degradation by various forms of radiation is key to device lifetimes and efficiencies. Therefore, these stabilized high-κ dielectric materials are useful in semiconductor devices and are useful for computer memory and logic applications, such as dynamic random access memory (DRAM) and complementary metal oxide semi-conductor (CMOS) circuitry.

In another embodiment of the invention, a high-κ dielectric film comprising hafnium oxide, titanium oxide or mixtures thereof, and further containing a permittivity maintaining or increasing amount of cerium atoms is provided.

In one embodiment, the film comprises a lattice, which is an array of points repeating periodically in three dimensions, and the lattice is comprised of hafnium oxide, titanium oxide, or mixtures thereof; and the lattice contains cerium atoms. The atoms are arranged upon the points of the lattice. The points form unit cells that fill the space of the lattice. The cerium may be substitutional on the Group IV atomic sites or located interstitially, as interstitial inclusions.

In one embodiment, the high-κ dielectric film is formed from at least one cerium precursor corresponding in structure to Formula I being delivered for deposition on to a substrate by a chemical phase deposition process, such as CVD or ALD, and various types of CVD and ALD, e.g. liquid, photo-assisted. Alternatively, the high-κ dielectric film may be formed from any other deposition method such as physical vapor deposition, e.g. sputtering.

As noted above, the film formed contains an amount of cerium atoms to maintain or increase permittivity.

In one embodiment the film contains from about 0.5 to about 35 atomic metal % cerium. In a particular embodiment the metal oxide or mixed metal oxide film contains from about 5 to about 20 atomic metal % cerium. In a further particular embodiment, the metal oxide or mixed metal oxide film contains from about 8 to about 12 atomic metal % cerium.

In one embodiment, the film formed has a formula of about $Ce_xM_{1-x}O_2$, where M is a metal, such as, hafnium, titanium or a mixture thereof. Particularly, a ratio of about 1:2 to about 1:9 cerium to metal is used to form the film.

In one embodiment, the film formed has a thickness from about 0.2 nm to about 500 nm.

In addition to phase stabilization discussed above, without being bound by theory, the cerium may also have an effect on the polarizability of the unit cell, i.e. the relative tendency of a charge distribution, like the electron cloud of an atom or molecule, to be distorted from its normal shape by an external electric field, which may be caused by the presence of a nearby ion or dipole. With cerium present it is hypothesized that this polarizability is enhanced which may impact the dielectric constant value beneficially by increasing or maintaining the dielectric constant longer. Polarizability of the unit cell coupled with stabilization of the highest dielectric constant phase of each metal oxide may ensure that the maximum dielectric constant value can be obtained from the particular material system in use.

Thus, in another embodiment, the film has a relative permittivity of about 20 to about 100, particularly from about 40 to about 70. Further, the film formed is capable of maintaining a relative permittivity of about 20 to about 100 at frequencies of about 1 KHz to about 1 GHz.

EXAMPLES

The following examples are merely illustrative, and do not limit this disclosure in any way.

Liquid Injection ALD Growth Conditions Using Ce(THD)$_4$

All depositions were performed on a modified Aixtron liquid injection oxide deposition system using standard operating protocols. The parameter variants are listed below.

| | |
|---|---|
| Substrate Temperature | 300° C. |
| Pressure | 5 mbar |
| Argon Flow | 200 cm$^3$ min$^{-1}$ |
| Evaporator Temperature | 160° C. |
| Injection rate | 2.5 µl per pulse |
| Solvent | Toluene |
| Concentration | 0.05M |
| Pulse sequence(precursor/purge/oxidant/purge) | 2/2/0.5/3.5 |
| Number of cycles | 15-300 |

First, ALD growth experiments were carried out whereby Ce was doped into HfO$_2$ at ratios of 1:2, 1:4 and 1:9. Cerium doped into ZrO$_2$ is discussed in Example 9 below.

The cerium precursor used was Ce(THD)$_4$ and the hafnium precursor used was bis methylcyclopentadienyl Hafnium methyl methoxide (HfD-04)

Samples S1300, S1302, S1318 and S1319 each represent cerium-doped hafnium oxide film formed. Each sample used Ce(THD)$_4$, except in a different ratio to hafnium.

Sample S1300 represents 1:2 Ce:Hf ratio.
Sample S1302 represents 1:4 Ce:Hf ratio.
Samples S1318 and S1319 represent 1:9 Ce:Hf ratio.

For all ALD experiments, ozone was used as the oxygen source.

Thin films of CeO$_2$ were deposited by ALD in the temperature range of 200-350° C.

Ce$_x$—Hf$_{1-x}$O$_2$ films were deposited on n-type Si(100) substrates using 0.05M solutions of [Ce(THD)$_4$] (fully characterised by elemental microanalysis and $^1$H NMR spectroscopy) and [(MeCp)$_2$HfMe(OMe)] (MeCp=CH$_3$C$_5$H$_4$) in toluene. The precursors were evaporated at 160° C. and the precursor solutions were injected in different ratios in order to vary the Ce atomic fraction in the films. An argon carrier gas flow rate of 200 cm$^3$ min$^{-1}$ was used with a reactor pressure of 5 mbar. A growth temperature of 200-350° C. was used. A growth temperature of 300° C. was chosen as the optimum for matching the deposition rates of CeO$_2$ and HfO$_2$ for the 1:9 ratio. Ozone was used as a source of oxygen and was introduced at the inlet of the reactor controlled by a pneumatic valve. The number of ALD cycles was in the range 15 to 300 and the [precursor solution/purge/O$_3$/purge/-] pulse sequences were [n/2.0 sec./0.50 sec./3.5 sec/-] (where n was varied according to precursor ratio used). In the pulse cycle a choice of Ce(THD)$_4$ or HfD-04 was employed for the precursor supply. The exact sequencing was used to control the stoichiometry of the film.

The pulse sequence for sample S1300 (1:2 Ce:Hf ratio) was (2/2/0.5/3.5)+2(2/2/0.5/3.5).

The pulse sequence for sample S1302 (1:4 Ce:Hf ratio) was (2/2/0.5/3.50+4(2/2/0.5/3.5).

The pulse sequence for samples S1318 and S1319 (1:9 Ce:Hf ratio) was (2/2/0.5/3.50) and +9(2/2/0.5/3.5), respectively.

Example 1

CeO$_2$ Versus HfO$_2$ Growth Rate by ALD

FIG. 1 is a graphical representation of cerium oxide (CeO$_2$) versus hafnium oxide (HfO$_2$) growth rate. CeO$_2$ growth was performed using Ce(THD)$_4$/O$_3$ in ALD, and is represented by the line with square points. HfO$_2$ growth was performed using bis methylcyclopentadienyl hafnium methyl methoxide (HfD-04)/O$_3$ in ALD, and is represented by the line with circle points.

FIG. 1 demonstrates a comparison between the individual precursor sources to show compatibility at the growth temperature used of around 300° C.

Example 2

ALD Growth Curve for Ce(THD)$_4$

Figure 2:
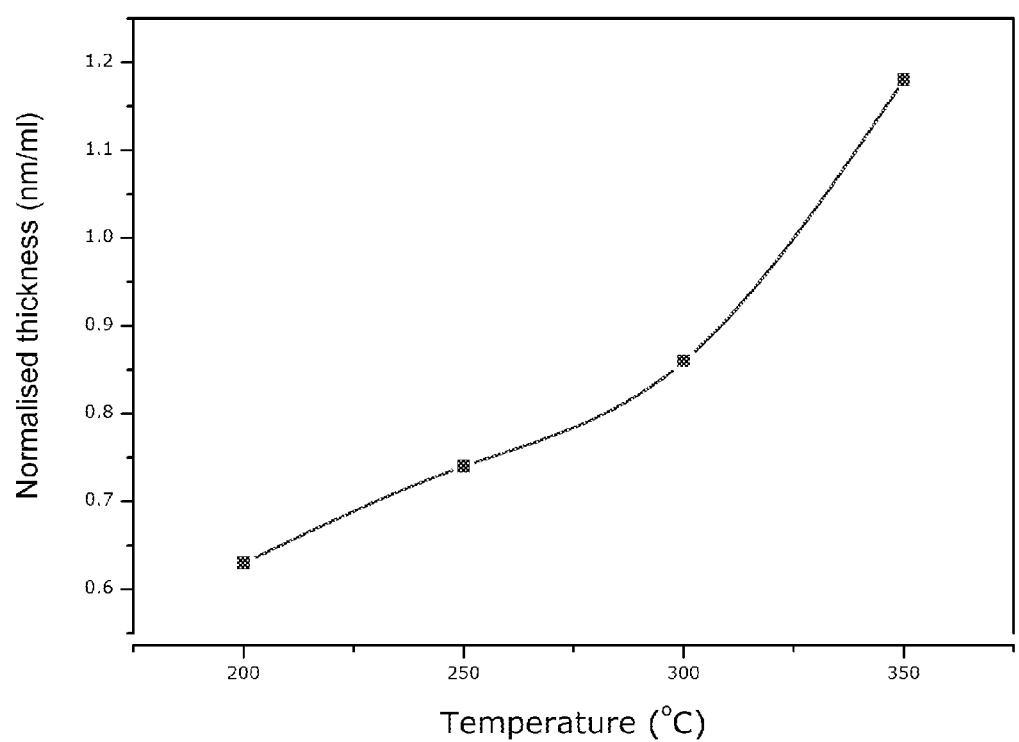
FIG. 2 is a graphical representation of ALD growth data for $Ce(THD)_4$ demonstrating normalized thickness (nm/ml) vs. temperature (° C.).

The effect of growth temperature on growth rates for CeO$_2$ is demonstrated in FIG. 2. FIG. 2 is a graphical representation of ALD growth data for Ce(THD)$_4$ demonstrating normalized thickness (nm/ml) vs. temperature (° C.).

Example 3

CVD Growth Curve for Ce(THD)$_4$

Figure 3:
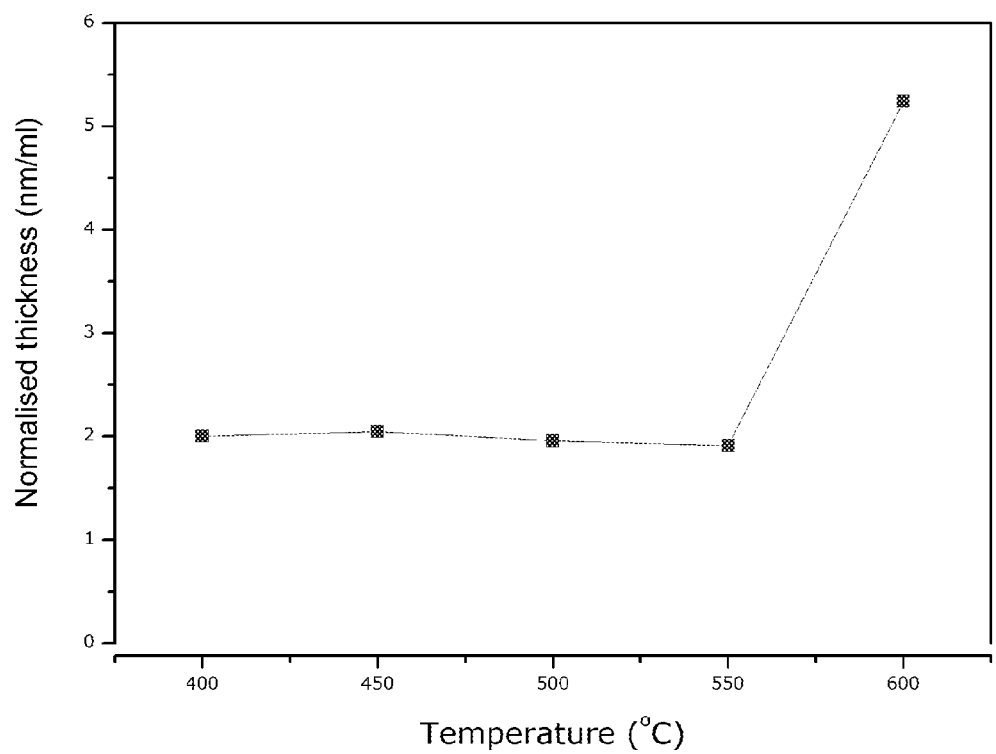
FIG. 3 is a graphical representation of CVD growth data for $Ce(THD)_4$ demonstrating normalized thickness (nm/ml) vs. temperature (° C.).

The effect of growth temperature on growth rates for CeO$_2$ is demonstrated in FIG. 3. FIG. 3 is a graphical representation of CVD growth data for Ce(THD)$_4$ demonstrating normalized thickness (nm/ml) vs. temperature (° C.).

Example 4

X-Ray Diffraction Analysis

Analysis by XRD was carried out on all as-grown CVD CeO$_2$ films. Each film demonstrates a peak around 29.00° characteristic of the (111) peak of CeO$_2$. This peak became more pronounced as the growth temperature increased.

Figure 4A:
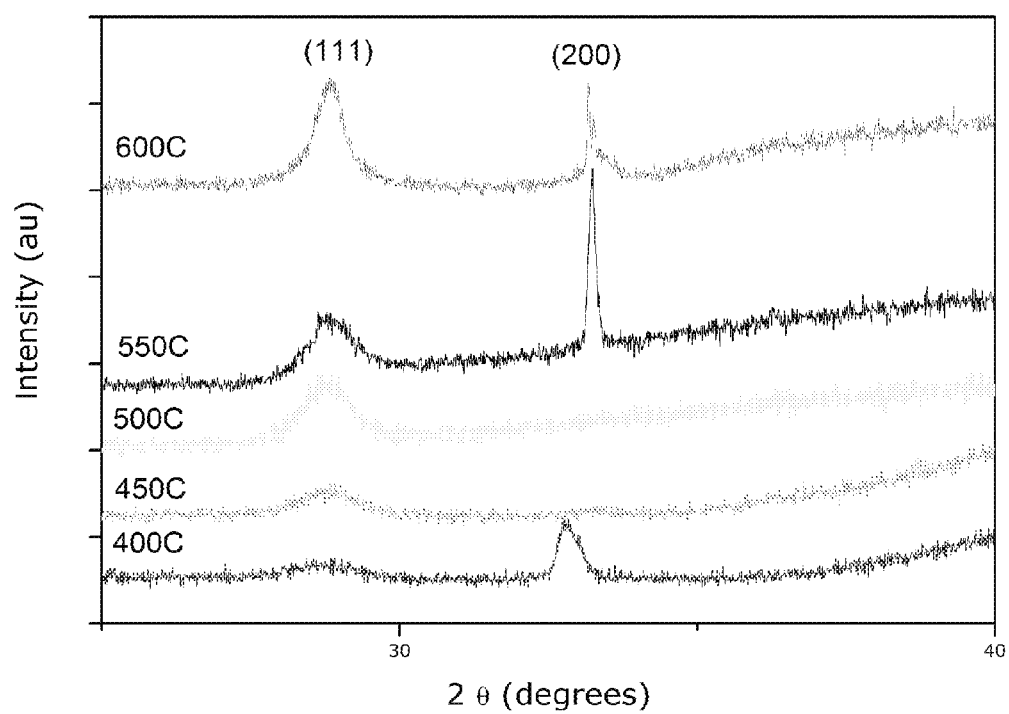
FIG. 4A is a graphical representation of X-Ray Diffraction (XRD) Spectroscopy of four $CeO_2$ films grown by CVD.

FIG. 4A is a graphical representation of XRD of four CeO$_2$ films grown by CVD.

XRD analysis (not shown, except FIG. 4B discussed below) of all of the films grown at 300° C. by ALD showed the absence of any significant diffraction features indicating that they were all essentially amorphous as-deposited. Afterwards the films were annealed in dry air at 900° C. for 15 min all of the films showed reflections (111) and (200) at ~30.5° and ~35.5° respectively. This is consistent with the formation of the Ce-stabilized cubic or tetragonal HfO$_2$ phases which are not readily distinguishable. The method produces amorphous films as grown that are annealed afterward to improve properties and get the correct phase films so permittivity increases and leakage is reduced over crystalline as grown films. This highlights an absence of crystallinity for the particular set of growth parameters used.

Figure 4B:
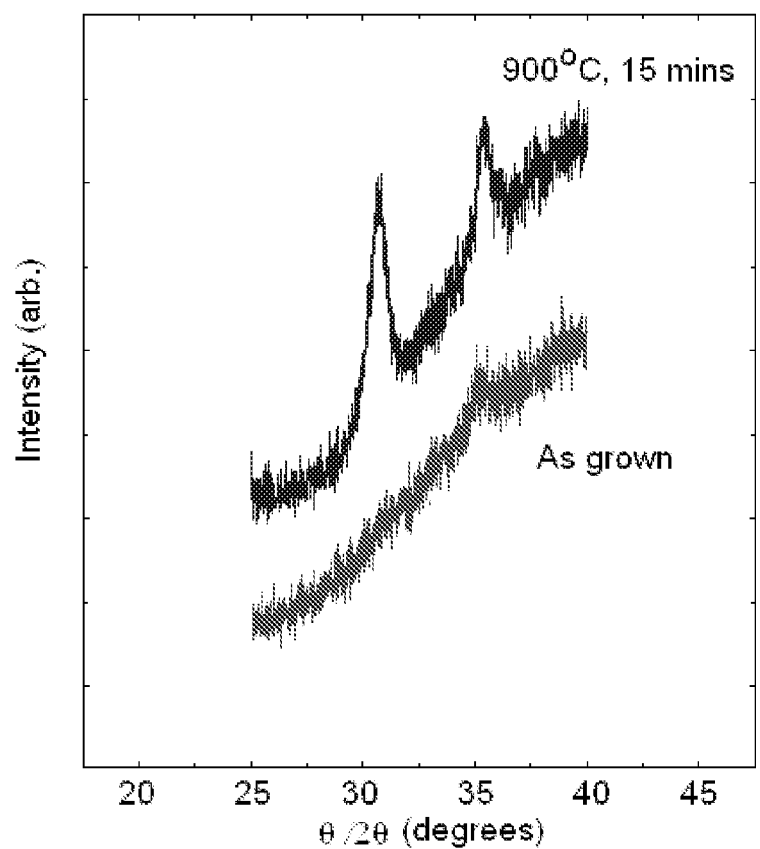
FIG. 4B is a graphical representation of XRD Spectroscopy of 10% Ce-doped $HfO_2$ (1:9 Cd:Hf ratio).

FIG. 4B is XRD analysis of 10% Ce-doped HfO$_2$. Annealing at 900° C., in vacuo, leads to cubic/tetragonal phase.

Example 5

X-Ray Reflectometry Measurements

Figure 5A:
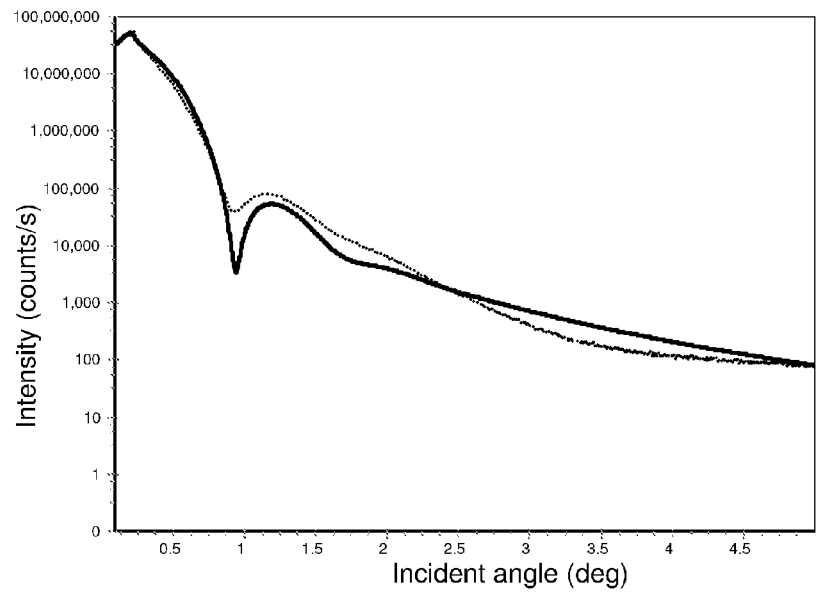
FIG. 5A is a graphical representation of X-Ray Reflectometry (XRR) demonstrating intensity (counts/s) versus incident angle (deg).

XRR measurements reveal that the film deposited with a ratio of 1:2 had about 30% Ce incorporated into the film, whereas the 1:4 ratio had about 20% Ce incorporation FIG. 5A is a graphical representation of XRR demonstrating intensity (counts/s) versus incident angle (deg). Ce was doped into HfO$_2$ at a ratio of 1:2. ALD was used to grow the film at a growth temperature of 300° C.

Figure 5B:
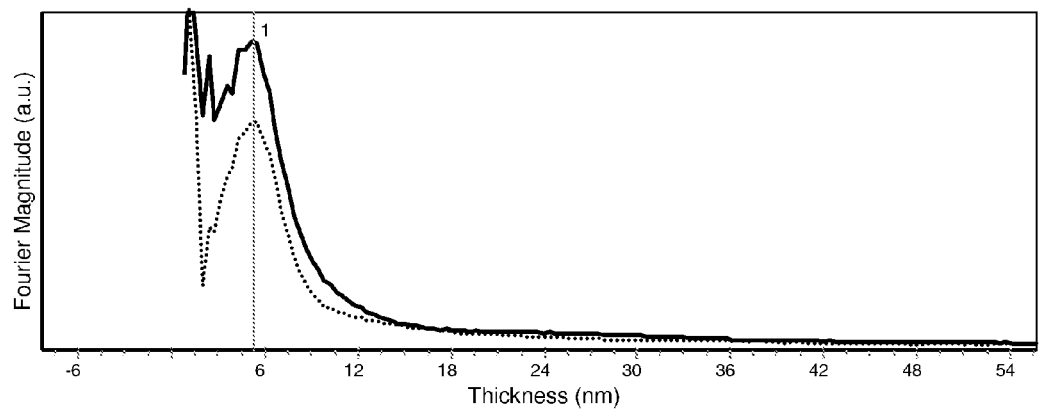
FIG. 5B is a graphical representation of XRR demonstrating Fourier magnitude (a.u.) versus thickness (nm).

FIG. 5B is a graphical representation of XRR demonstrating Fourier magnitude (a.u.) versus thickness (nm). Ce was doped into HfO$_2$ at a ratio of 1:2. ALD was used to grow the film at a growth temperature of 300° C.

Thickness of the film was 5.2 nm for XRR of 1:2 ratio.

Figure 6A:
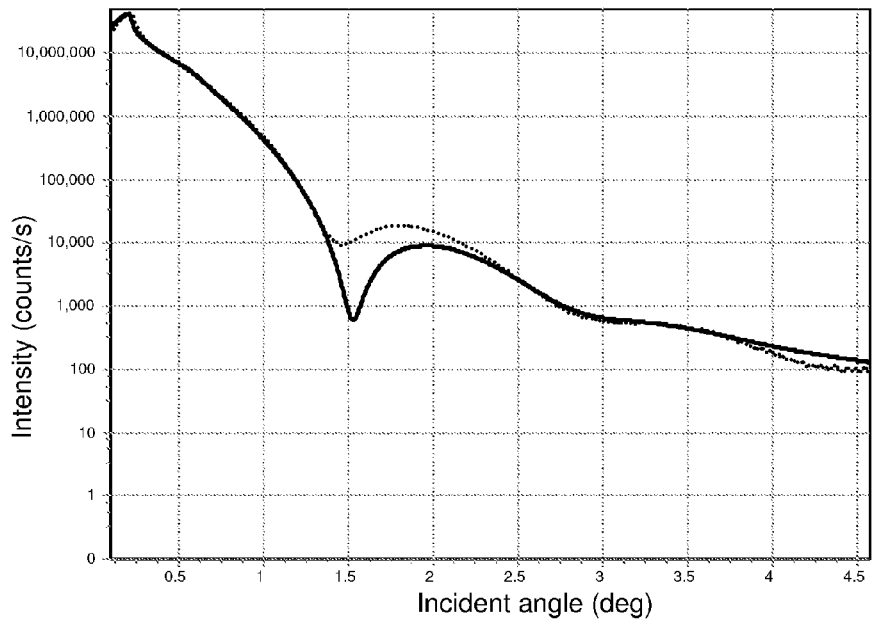
FIG. 6A is a graphical representation of XRR demonstrating intensity (counts/s) versus incident angle (deg).

FIG. 6A is a graphical representation of XRR demonstrating intensity (counts/s) versus incident angle (deg). Ce was doped into HfO$_2$ at a ratio of 1:4. ALD was used to grow the film at a growth temperature of 300° C.

Figure 6B:
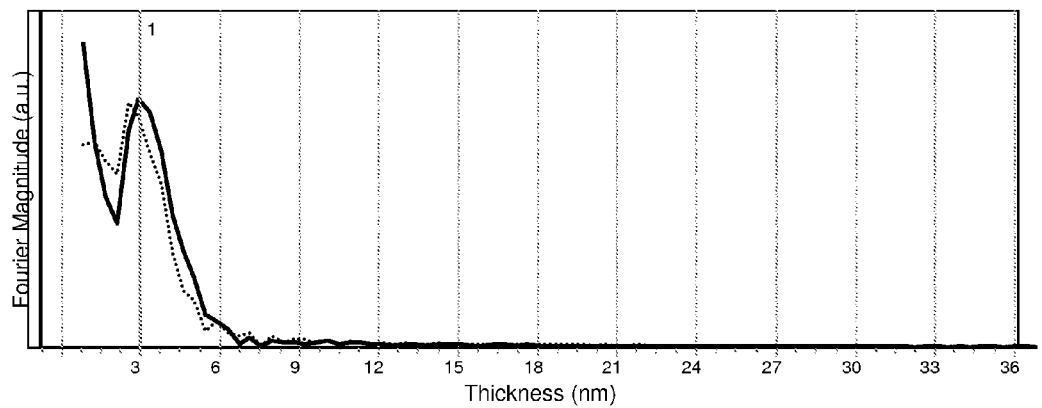
FIG. 6B is a graphical representation of XRR demonstrating Fourier magnitude (a.u.) versus thickness (nm).

FIG. 6B is a graphical representation of XRR demonstrating Fourier magnitude (a.u.) versus thickness (nm). Ce was doped into HfO$_2$ at a ratio of 1:4. ALD was used to grow the film at a growth temperature of 300° C.

Thickness of the film was 3.0 nm for XRR of 1:4 ratio.

Density

Density of the film can be calculated by using:

Ce doped HfO$_2$=8.7

CeO$_2$=7.2

Therefore:

$$8.7 = 7.2x + 9.8 - 9.8x \quad \text{i.)}$$

$$2.6x = 0.9 \quad \text{ii.)}$$

$$X 0.9/2.6 = 0.34 \text{ or } 34\% \quad \text{iii.)}$$

Example 6

Electrical Measurements

Figure 7A:
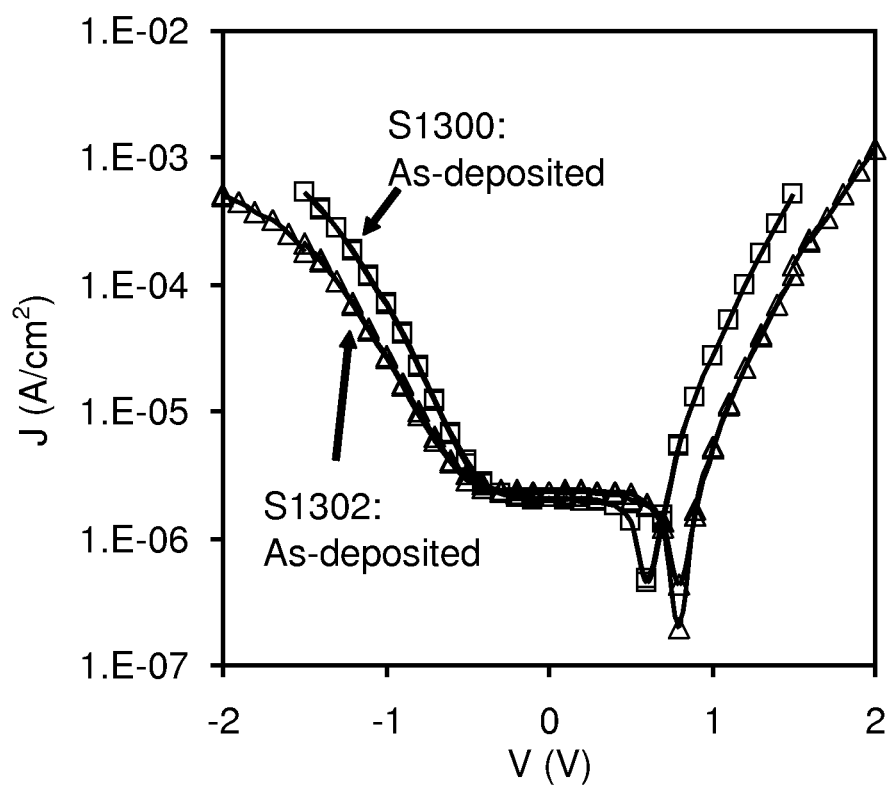
FIG. 7A is a graphical representation of J ($A/cm^2$) versus voltage (V) of two separate samples of Ce-doped $HfO_2$ (S1300 and S1302).

FIG. 7A is a graphical representation of J (A/cm$^2$) versus voltage (V) of two separate samples of Ce-doped HfO$_2$ (S1300 and S1302). FIG. 7A shows that a larger leakage current was observed in sample S1300 than for sample S1302. The applied bias voltage range is −1.5 to +1.5V for S1300, and is −2 to +2V for S1302.

Figure 7B:
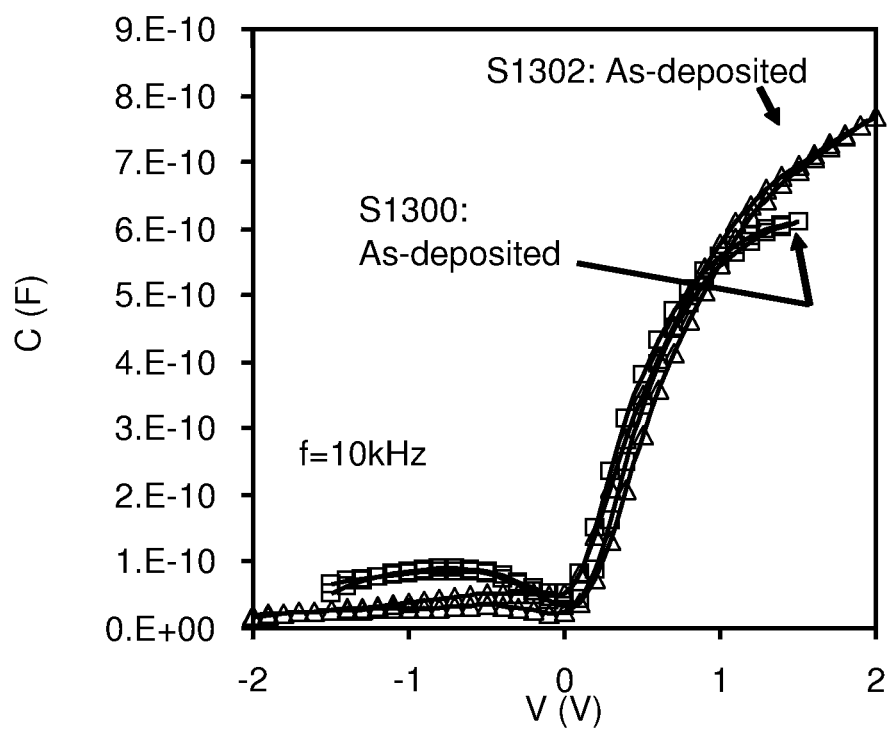
FIG. 7B is a graphical representation of capacitance (F) versus voltage (V) of two separate samples of Ce-doped $HfO_2$ (S1300 and S1302).

FIG. 7B is a graphical representation of Capacitance (F) versus voltage (V) of two separate samples of Ce-doped HfO$_2$ (S1300 and S1302) which shows accumulation from which the dielectric constant is derived.

Based on C-V tests, if one can assume the thickness of CeHfO$_2$ is 6 nm and the interfacial layer (IL) is 1 nm (native SiO$_2$), then κ of S1300 is 17, while κ of S1302 is 22.

Figure 7C:
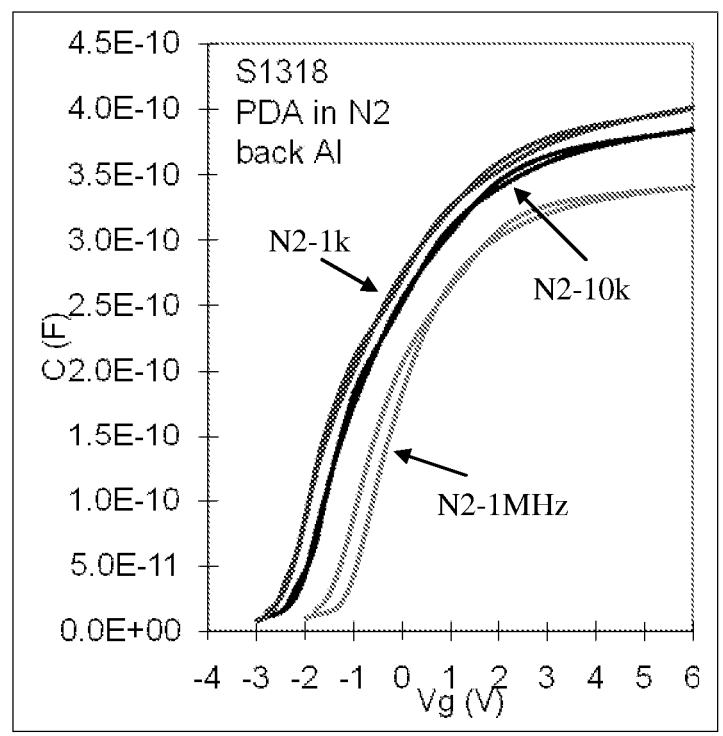
FIG. 7C is a graphical representation of capacitance (F) versus voltage (V) of sample S1318 (1:9 Ce:Hf ratio) of Ce-doped $HfO_2$.
Figure 7D:
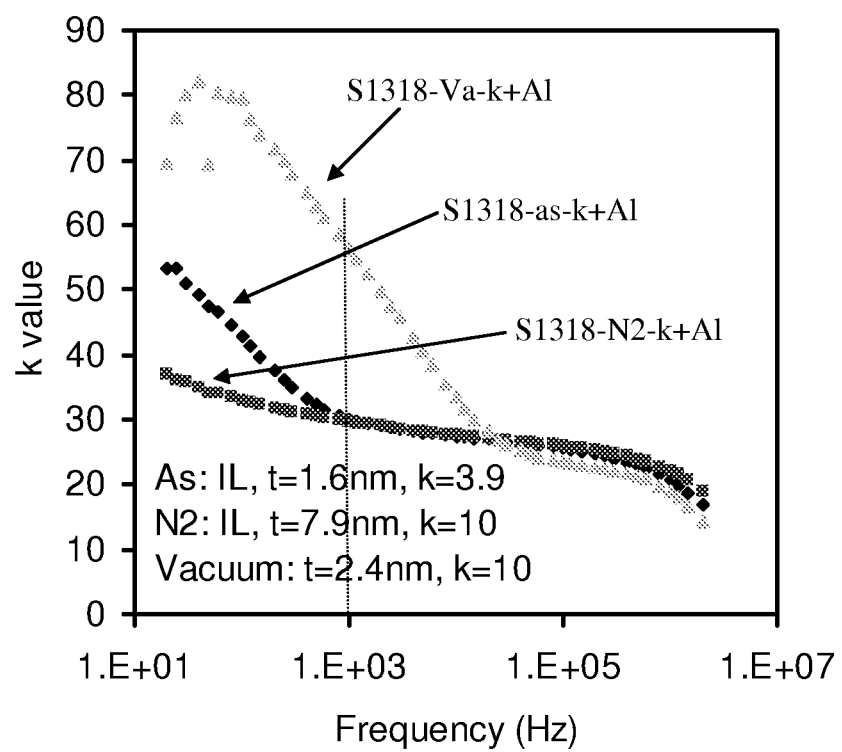
FIG. 7D is a graphical representation of κ-value versus frequency (Hz) of sample S1318 (1:9 Ce:Hf ratio) of Ce-doped $HfO_2$ for as-grown, vacuum and $N_2$ annealing.

FIGS. 7C and 7D represent C-V characteristics of 10% Ce-doped HfO$_2$ (1:9 Ce:Hf ratio, sample S1318), which demonstrates an improvement in permittivity and performance. This also demonstrates that the maximum permittivity is achieved close to the 10% doping level or less.

Figure 7E:
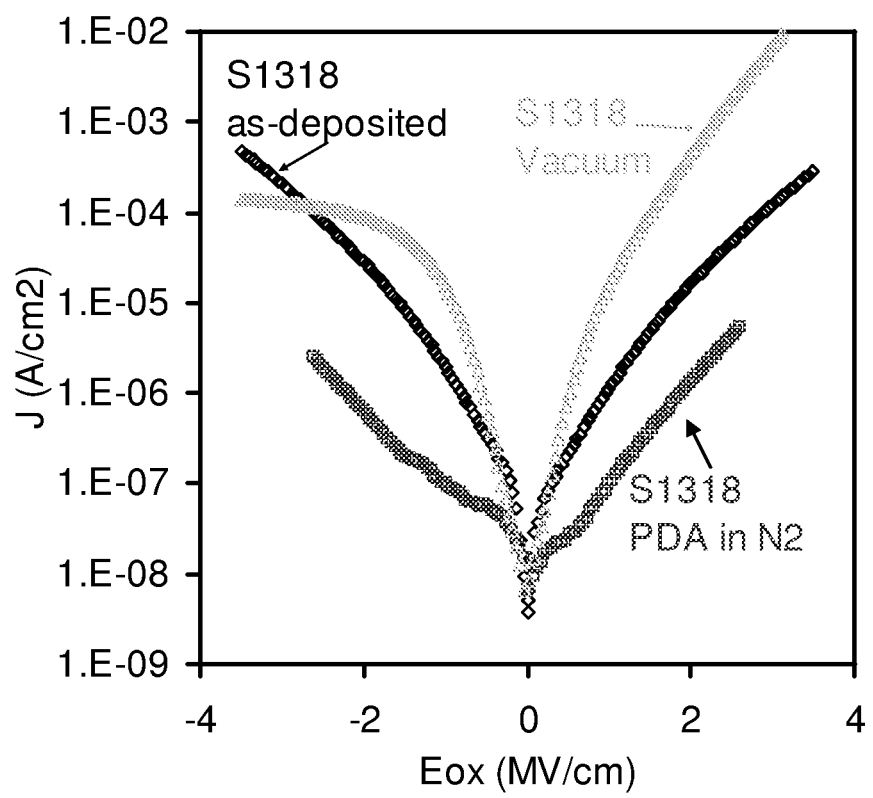
FIG. 7E is a graphical representation of J ($A/cm^2$) versus $E_{ox}$ (MV/cm) of sample S1318 (1:9 Ce:Hf ratio) of Ce-doped $HfO_2$ for as-deposited, vacuum and $N_2$ annealing.

FIG. 7E is a graphical representation of J (A/cm$^2$) versus $E_{ox}$ (MV/cm) of the S1318 (1:9 Ce:Hf ratio) sample for 10% Ce-doped HfO$_2$ for as-deposited, vacuum and N$_2$ annealing.

Figure 7F:
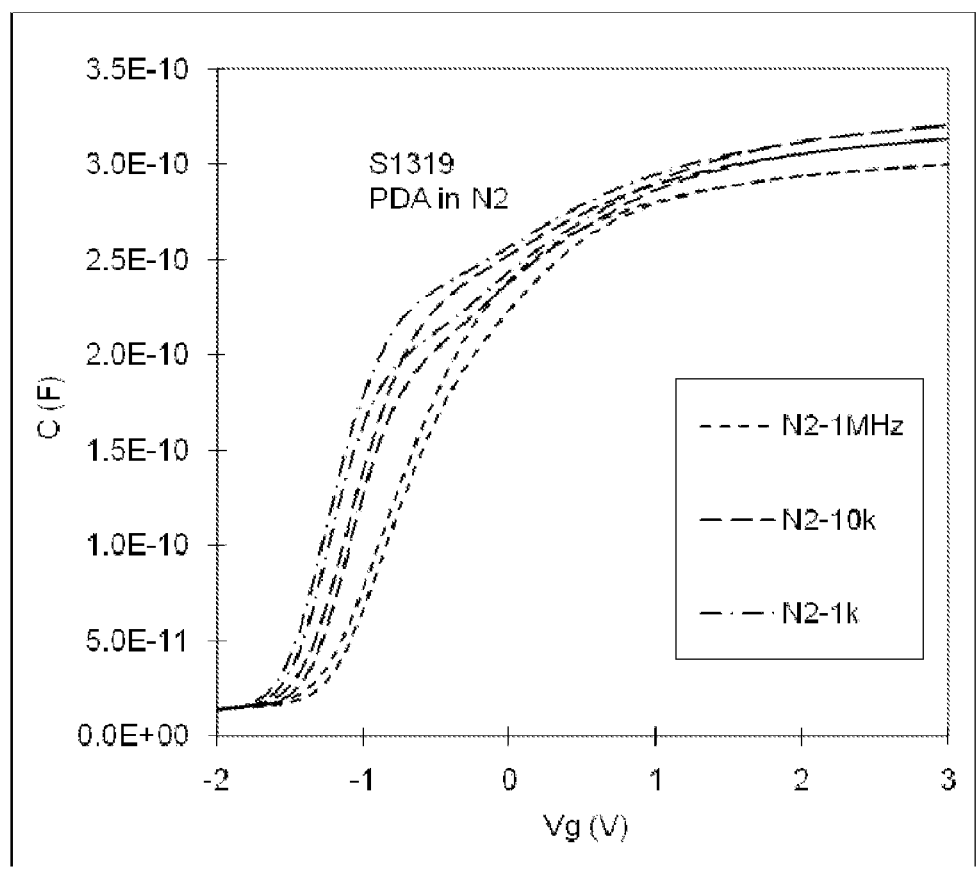
FIG. 7F is a graphical representation of capacitance (F) versus voltage (V) of sample S1319 (1:9 Ce:Hf ratio) of Ce-doped $HfO_2$.
Figure 7G:
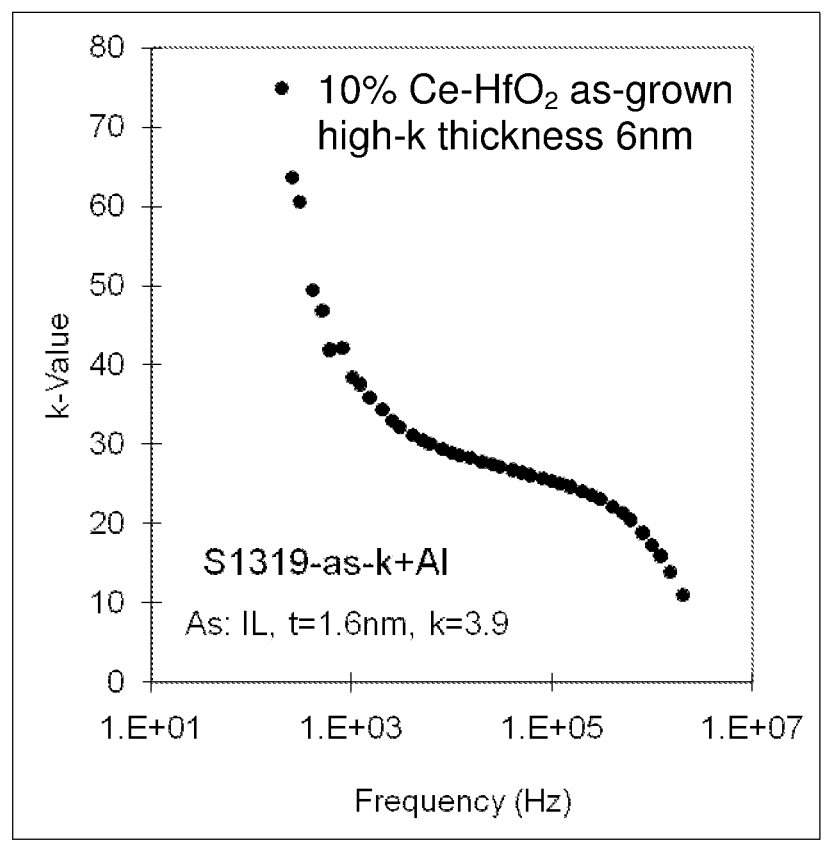
FIG. 7G is a graphical representation of κ-value versus frequency (Hz) of sample S1319 (1:9 Ce:Hf ratio) of Ce-doped $HfO_2$ for as-grown.

FIGS. 7F and 7G represent C-V characteristics of 10% Ce-doped HfO$_2$ (1:9 Ce:Hf ratio, sample S1319).

Figure 7H:
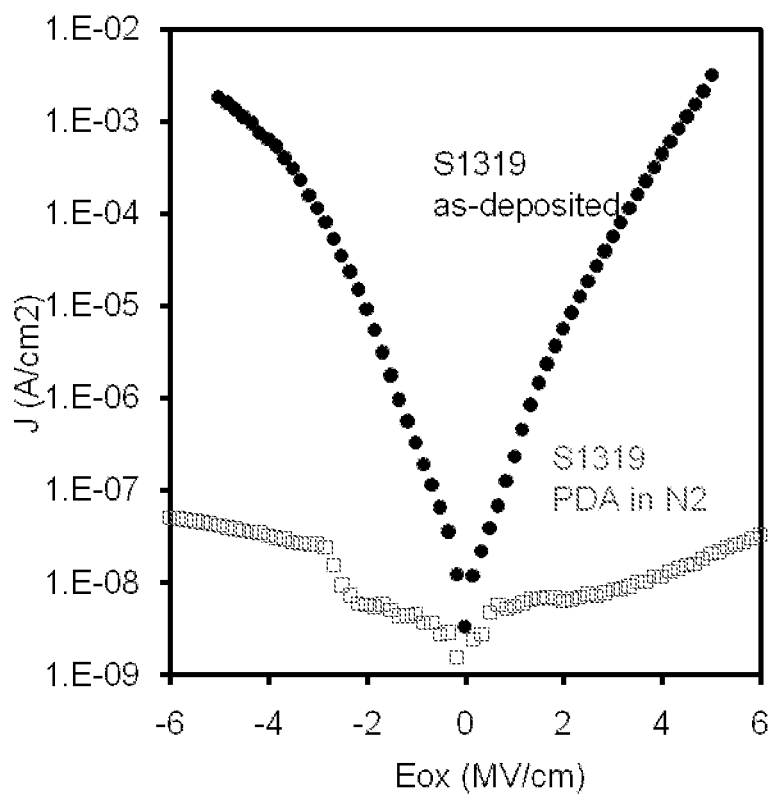
FIG. 7H is a graphical representation of J ($A/cm^2$) versus $E_{ox}$ (MV/cm) of the S1319 (1:9 Ce:Hf ratio) sample for 10% Ce-doped $HfO_2$ for as-deposited, vacuum and $N_2$ annealing.

FIG. 7H is a graphical representation of J (A/cm$^2$) versus $E_{ox}$ (MV/cm) of the S1319 (1:9 Ce:Hf ratio) sample for 10% Ce-doped HfO$_2$ for as-deposited, vacuum and N$_2$ annealing.

FIGS. 7E through 7H also demonstrate that the Ce doping does not adversely influence leakage effects.

Figure 7I:
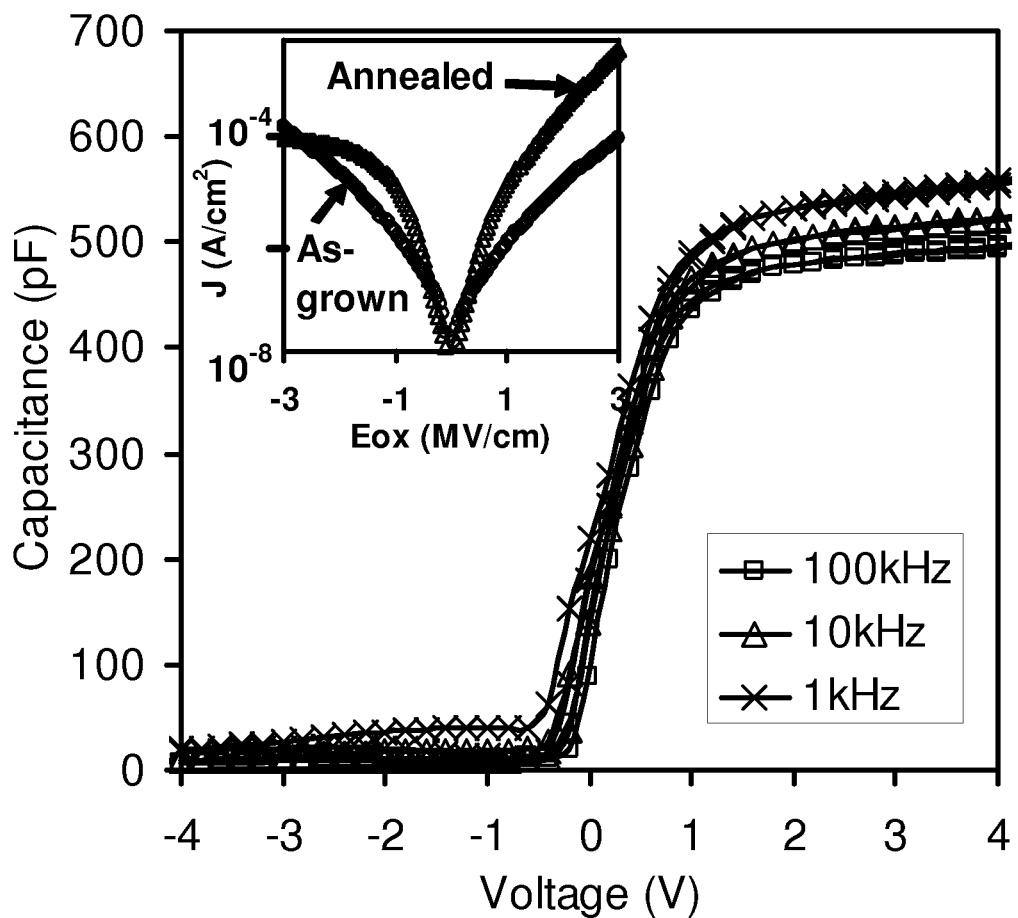
FIG. 7I is a graphical representation of capacitance (pF) versus voltage (V) data on a [Au/$Ce_{0.1}$—$Hf_{0.9}O_2$/Si/Al] Metal Oxide Semiconductor Capacitor (MOSC) structure after vacuum annealing at 900° C.

FIG. 7I is C-V data on a [Au/Ce$_{0.1}$—Hf$_{0.9}$O$_2$/Si/Al] MOSC structure after vacuum annealing at 900° C. The C-V data shows low hysteresis voltages as the applied gate bias changed from strong inversion towards strong accumulation and vice versa ($V_{hysteresis}$~0.05V). The experimental flat band voltage ($V_{FB}$) in the film was found to be around ~0.5 V, which is close to the ideal flatband voltage of ~0.7V for a [Au/dielectric/n-Si] MOS capacitor structure. This indicates that only a small amount of trapped oxide charges were created after vacuum annealing. The density of oxide trapped charges ($N_{OT}$) is a figure of merit for the quality of a dielectric film and was found to be positive (~8.8×10$^{11}$ cm$^{-2}$) which is reasonably low for HfO$_2$ based high-k dielectrics. The density of interface states was found to be $D_{it}$, ~7.5×10$^{11}$ cm$^{-2}$ eV$^{-1}$. The relative permittivity (κ) of 32 was extracted from the accumulation capacitance at 100 kHz, taking into account the presence of a 2.1 nm SiO$_2$ interlayer (FIG. 11B). The thickness of the interlayer is attributed to the use of ozone, rather than water, as an oxidant. The measurement frequency of 100 kHz is commonly used, however some dispersion of the CV curves at lower frequencies was observed for our samples and this phenomenon is currently under investigation. The permittivity of 32 represents an increase from a κ of 25 obtained from the as-grown sample which is attributed to the transformation from an amorphous to crystalline phase. A κ value of 19 was obtained from un-doped HfO$_2$ using the same precursor. Current voltage (J-$E_{ox}$) curves (FIG. 7I, inset) for the Ce$_{0.1}$—Hf$_{0.9}$O$_2$ film shows that the as-grown material has a leakage current density at an oxide field of ±1 MV cm$^{-1}$ of 1.13~1.92×10$^{-6}$ Acm$^{-2}$. After vacuum annealing at 900° C., the leakage current density increases to ~1.58×10$^{-5}$ Acm$^{-2}$, which is attributable to the crystallization of the layer and the formation grain boundary leakage pathways.

Example 7

MEIS Results

Medium energy ion scattering (MEIS) experiments were performed to investigate the high-κ film composition and structure. A nominally 200 keV $He^+$ ion beam was employed with a current of up to 200 nA and a dose per data set of 2.4 μC. The sample was aligned so that the incident $He^+$ ion beam was parallel to the sample <111> direction. The angle and energy of the scattered ions was determined using a state-of-the-art toroidal electrostatic energy analyzer with position-sensitive detector. This allows simultaneous collection of ions from a 27° range of scattering angles and with a range of energies equal to 1.6% of the analyzer pass energy.

Figure 8:
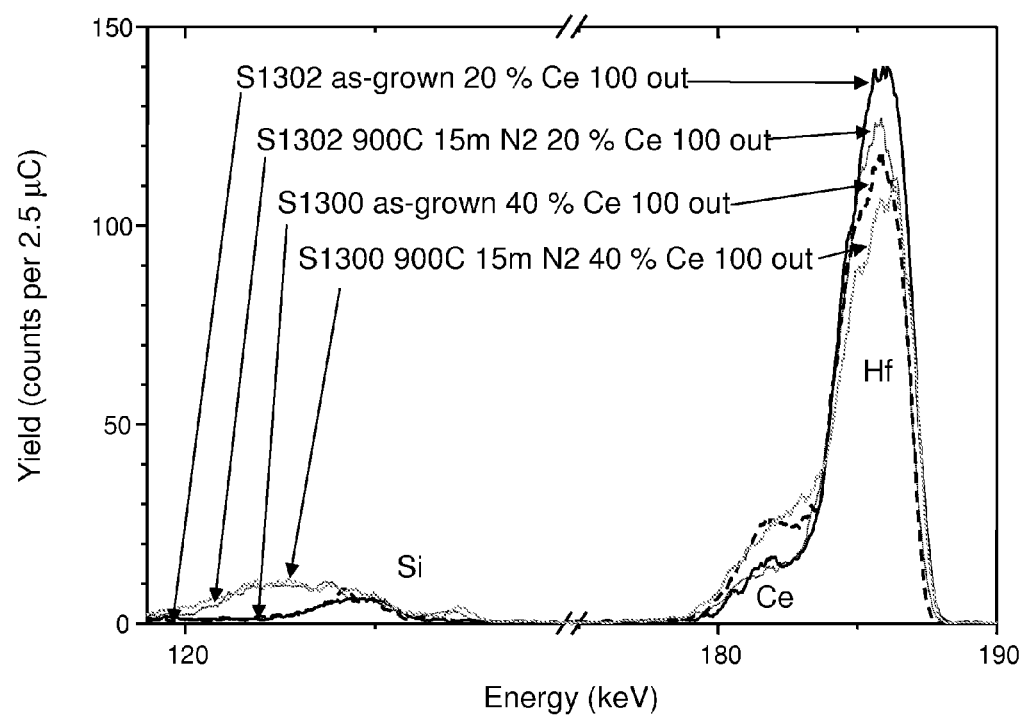
FIG. 8 is a graphical representation of Medium Ion Energy Scattering (MEIS) energy spectra demonstrating Yield (counts per 2.5 μC) versus Energy (keV) for samples S1302 and S1300.
Figure 9:
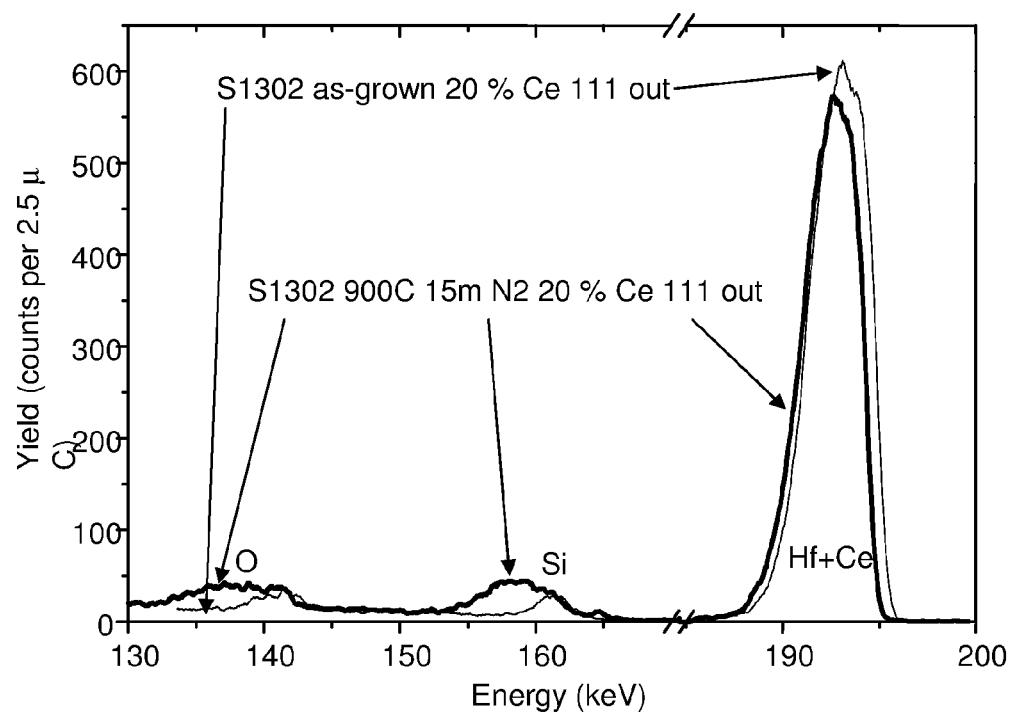
FIG. 9 is a graphical representation of MEIS energy spectra demonstrating Yield (counts per 2.5 μC) versus Energy (keV) for sample S1302.

MEIS energy spectra from the (100) and (111) blocking directions are shown in FIG. 8 and FIG. 9 respectively for Samples S1302 and S1300. Samples S1302 and S1300 are shown (1) as-grown and (2) furnace annealed at 900° C. for 15 min in $N_2$.

In spectra taken from along the (100) blocking direction, shown in FIG. 8, the Hf and Ce peaks are distinguishable, but with some overlap of the back edge of the Hf peak and the leading edge of the Ce. The oxygen peak cannot be obtained with the (100) blocking direction due to masking by doubly charged $He^+$ scattering off Hf. Spectra from the (111) blocking direction (FIG. 9) do include the oxygen peak, but the Hf and Ce peak overlap and cannot be separated. There appears to be only a small amount of rearrangement of the Hf and Ce following annealing. The Hf peak height is reduced slightly following annealing. Spectra from the annealed samples show a small Si peak closer to the surface. This could be due to a movement of Si through the high-κ layer towards the surface or be due to pinholes in the high-κ layer.

Figure 10:
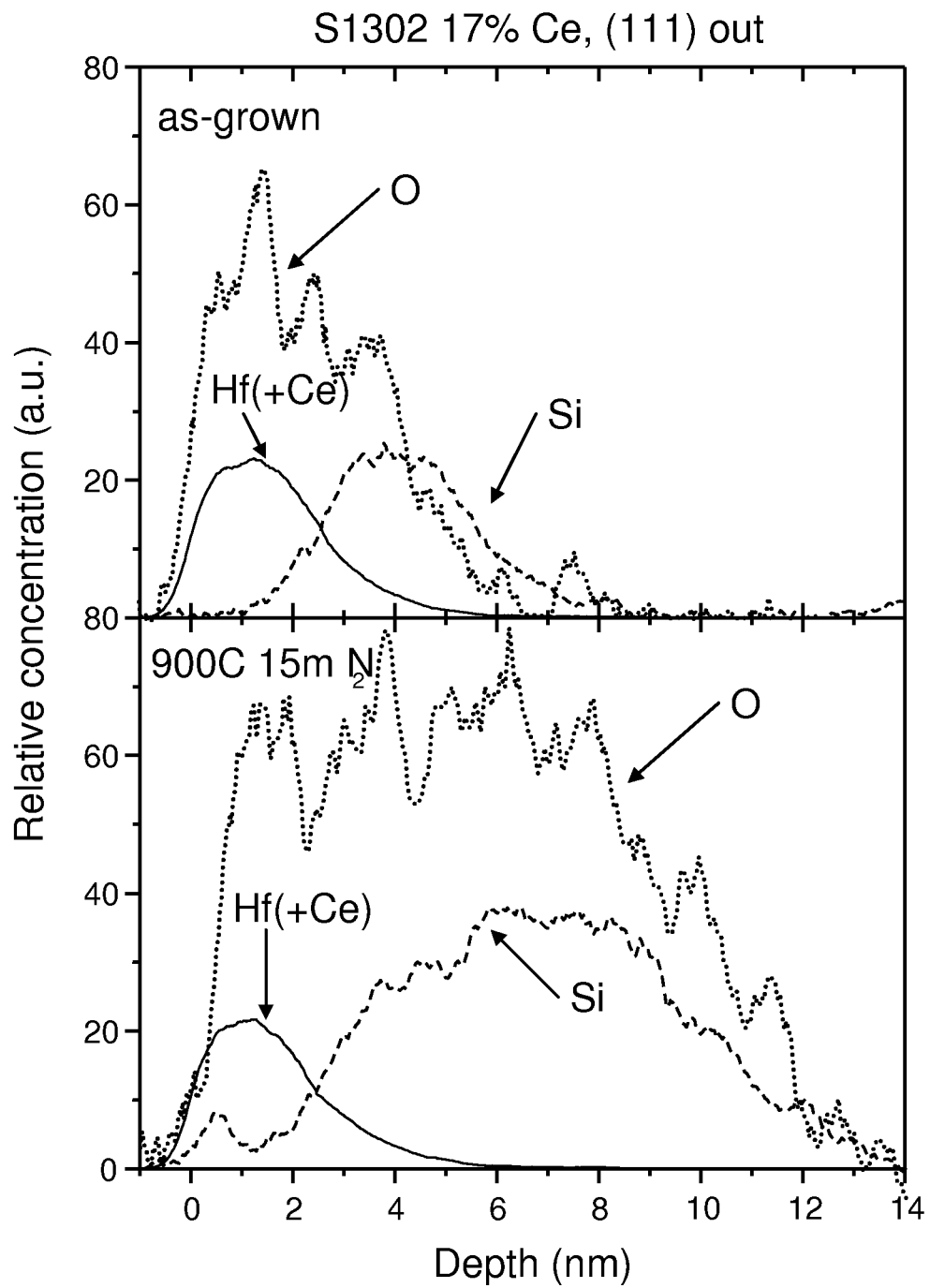
FIG. 10 is MEIS depth profiles from the (111) blocking position demonstrating Relative Concentration (a.u.) versus Depth (nm) for sample S1302.

In FIG. 10, the energy spectra from the (111) blocking direction have been converted into depth profiles. This was calibrated on the basis of the stopping powers obtained from MUM 2006 for a nominal 'average' compound of $Ce_{0.25}Hf_{0.5}O_2$ with a density of 9.18 g/cm$^3$, and in $SiO_2$ where appropriate.

The measured, approximate layer thicknesses are as follows:

|  | high-κ layer | $SiO_2$ |
| --- | --- | --- |
| as-grown | 2.7 nm | 1.6 nm |
| annealed | 2.5 nm | 7.9 nm |

The amount of growth of the silicon oxide interfacial layer is very high. In comparison, with the La doped Zr samples a 4.5 nm thick interfacial layer was formed.

There appears to be no deeper diffusion of Hf or Ce into the interfacial layer. A small amount of Si has diffused through the layer towards the surface.

Figure 11:
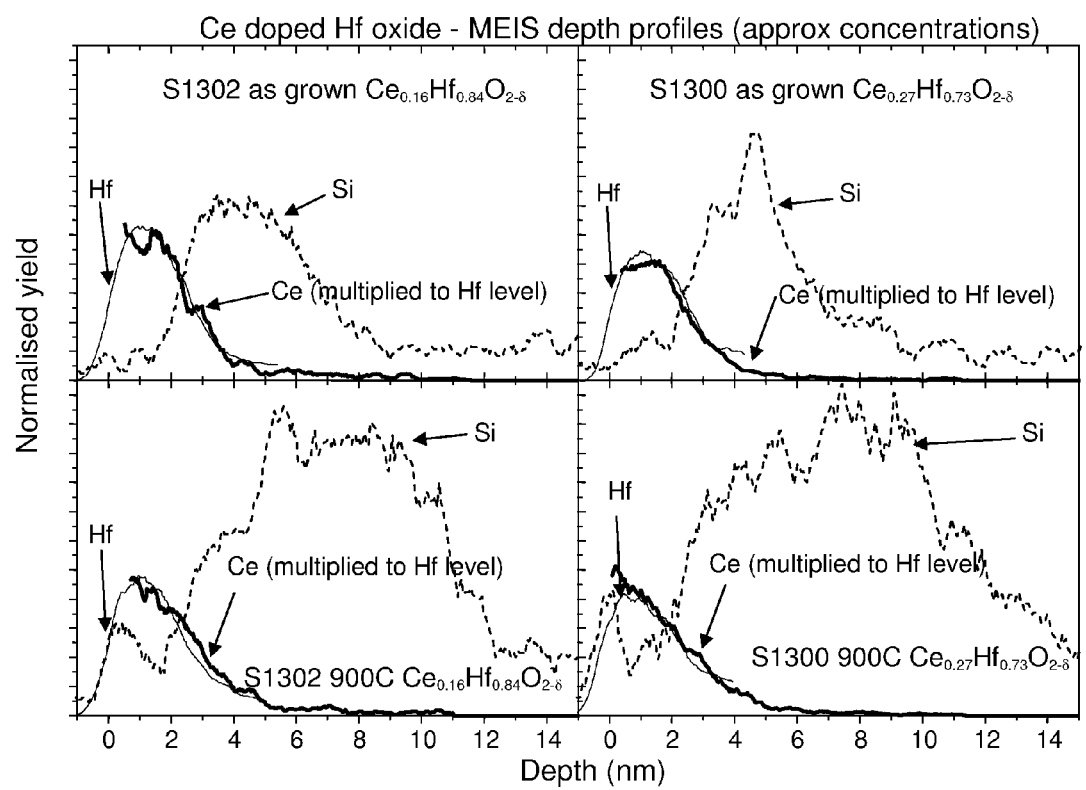
FIG. 11 is MEIS depth profiles from the (100) blocking position demonstrating Relative Concentration (a.u.) versus Depth (nm) for sample S1302 and S1300.

In FIG. 11, energy spectra from along the (100) blocking direction have been converted into depth profiles for Hf, Ce and Si. The yield of the peaks have been normalized to Si to account for differences in scattering cross section. The leading edge of the Ce peak overlaps with the back edge of the Hf peak. Rather than trying to separate the peaks, the yields of the Ce profiles have been multiplied by arbitrary amounts to bring them in line with the Hf peaks.

By this method the Ce concentrations are calculated to be approximately 16% and 27%.

There does not appear to be any variation in the Ce to Hf ratio throughout the layer.

Annealing produces a small reduction in layer width (~0.2 nm).

The annealed samples have a Si surface peak.

Growth in the $SiO_2$ layer following annealing has been observed. However, if there is growth, downstream processes can be used to alter such growth.

The approximate $SiO_2$ layer thickness is inferred from the Si peak width, by subtracting the width of the Hf peak and an arbitrary 1 nm to account for scattering off Si beneath the oxide, from the depth of the back edge of the Si peak.

|  | Hf width (nm) | ~$SiO_2$ width (Back edge-Hf peak-1 nm) |
| --- | --- | --- |
| S1302 as grown (100) | 2.7 | 2 |
| S1302 900 C 15 m (100) | 2.5 | 7.5 |
| S1300 as grown (100) | 2.7 | 1.8 |
| S1300 900 C 15 m (100) | 2.5 | 8.5 |

Figure 11A:
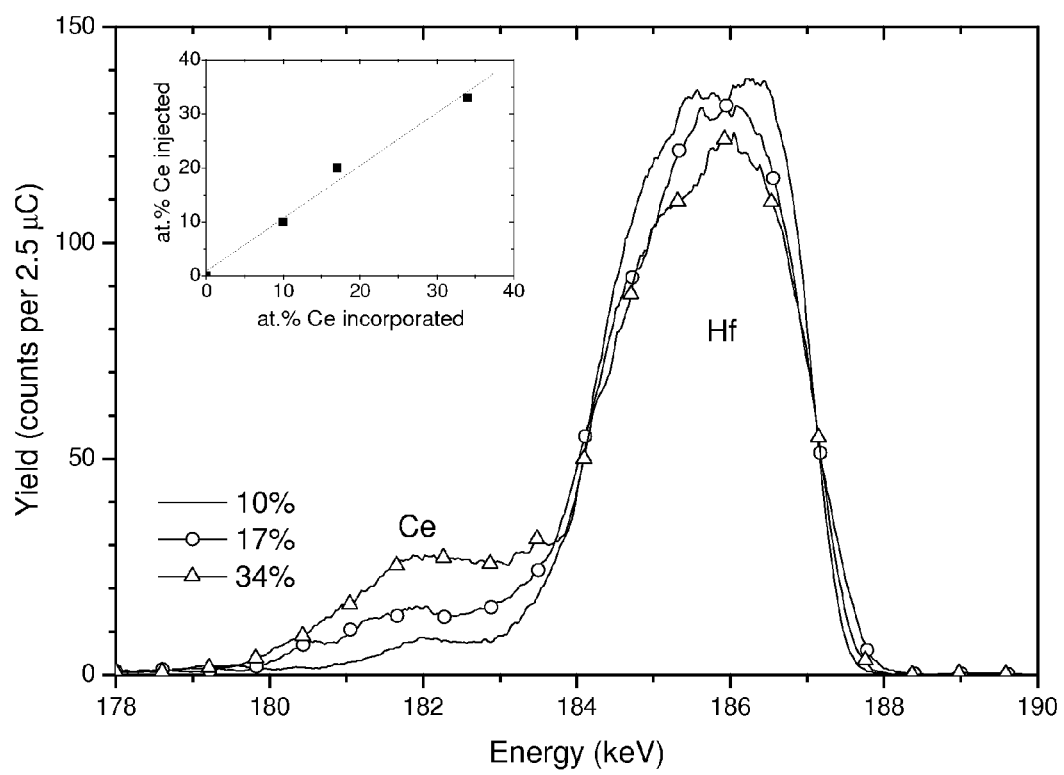
FIG. 11A is a graphical representation of MEIS energy spectra demonstrating Yield (counts per 2.5 μC) versus Energy (keV) for 1:2, 1:4 and 1:9 Ce:Hf ratio films.
Figure 11B:
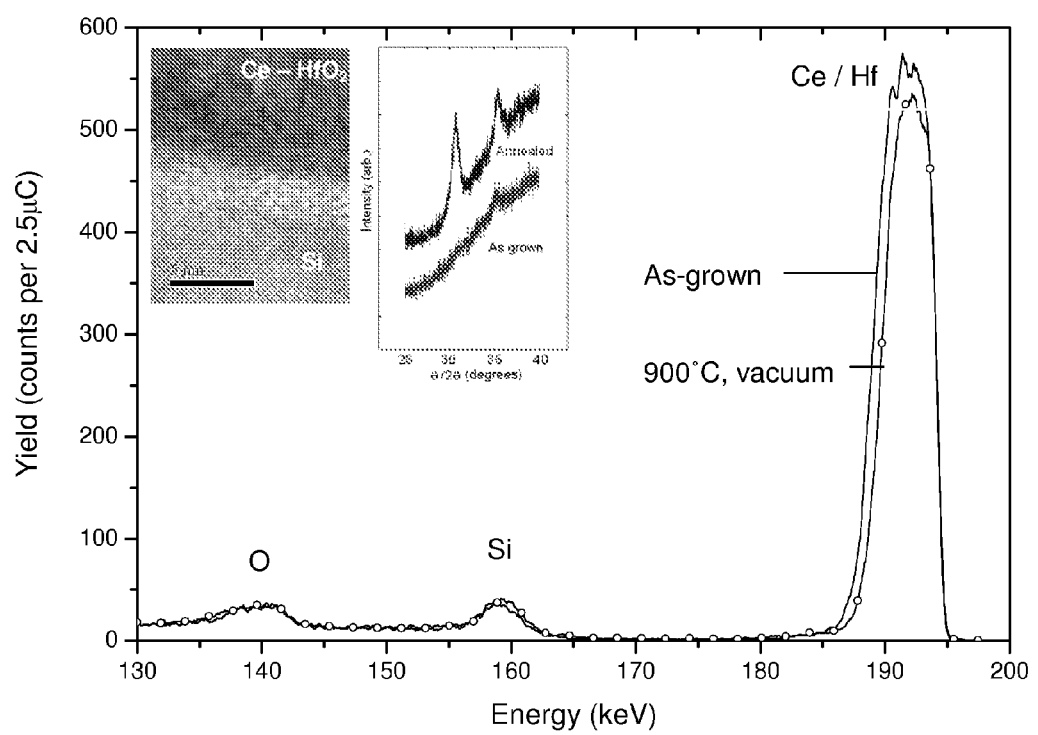
FIG. 11B is a graphical representation of MEIS energy spectra demonstrating Yield (counts per 2.5 μC) versus Energy (keV) for 1:9 Ce:Hf ratio film.

FIG. 11A represents MEIS data for all three ratios used, 1:2, 1:4 and 1:9 Ce:Hf. Based on the heights of the Hf and Ce peaks, the Ce concentrations are 34% S1300 (1:2 Ce:Hf) and 17% for S1302 (1:4 Ce:Hf) and 10% for S1318/S1319 (1:9 Ce:Hf). FIG. 11A shows the energy spectrum of the hafnium and cerium contents of the three $Ce_x$—$Hf_{1-x}O_2$ films recorded at a scattering angle of 125.3° to collect ions emerging from the <100> direction. Under these conditions scattered ions come from within approximately 50 nm of the surface and the Ce and Hf content of the films can be effectively mass separated. This enables the atomic composition of the films to be evaluated. The compositions of the films were estimated from the integrated peak areas using the ratio of the scattering cross sections and were corroborated using SIMNRA models. In FIG. 11A, the energy spans of the spectra have been normalized to correct for any thickness variations between the different films in order to allow comparison. Analysis of the $Ce_{0.17}Hf_{0.83}O_2$ and $Ce_{0.34}Hf_{0.66}O_2$ films by Auger electron spectroscopy showed that carbon contamination was absent at an estimated detection limit of ~0.5 at. %. The inset in FIG. 11A shows that there is a linear relationship between the cerium precursor mol. fraction injected and cerium incorporated (at. %) in the high-κ film.

FIG. 11B shows the MEIS energy spectrum from a 4.5 nm thick $Ce_{0.1}$—$Hf_{0.9}O_2$ film (1:9 Ce:Hf) before and after vacuum annealing at 900° C. The scattered ions were collected at an angle of 70.5° from the <111> direction to enable the heavy ions (Hf and Ce) to be collected as well as the oxygen and silicon signals. At this geometry, the silicon from the deeper silicon substrate is suppressed by channel 'shadowing' and 'blocking'. Only silicon atoms from the top few atomic layers or any amorphous silicon in the interlayer oxide are evident. The energy spectra show that the effect of annealing in vacuum is to prevent any further oxidation of the silicon. However some reduction in the hafnium distribution may indicate a small loss during annealing. The inset in FIG. 11B shows a cross sectional transmission electron micrograph of the as-grown $Ce_{0.1}$—$Hf_{0.9}O_2$. The $SiO_2$ interlayer thickness is confirmed to be 2.1 nm and the high-κ layer shows a small crystalline content but otherwise the Transmission Electron Microscopy (TEM) data indicates an amorphous microstructure. The inset also shows XRD patterns of the $Ce_{0.1}$—$Hf_{0.9}O_2$ sample before and after annealing. A small diffraction feature is evident in the as-grown sample, however annealing transforms the film into a polycrystalline layer of either the cubic or tetragonal phase.

Figure 11C:
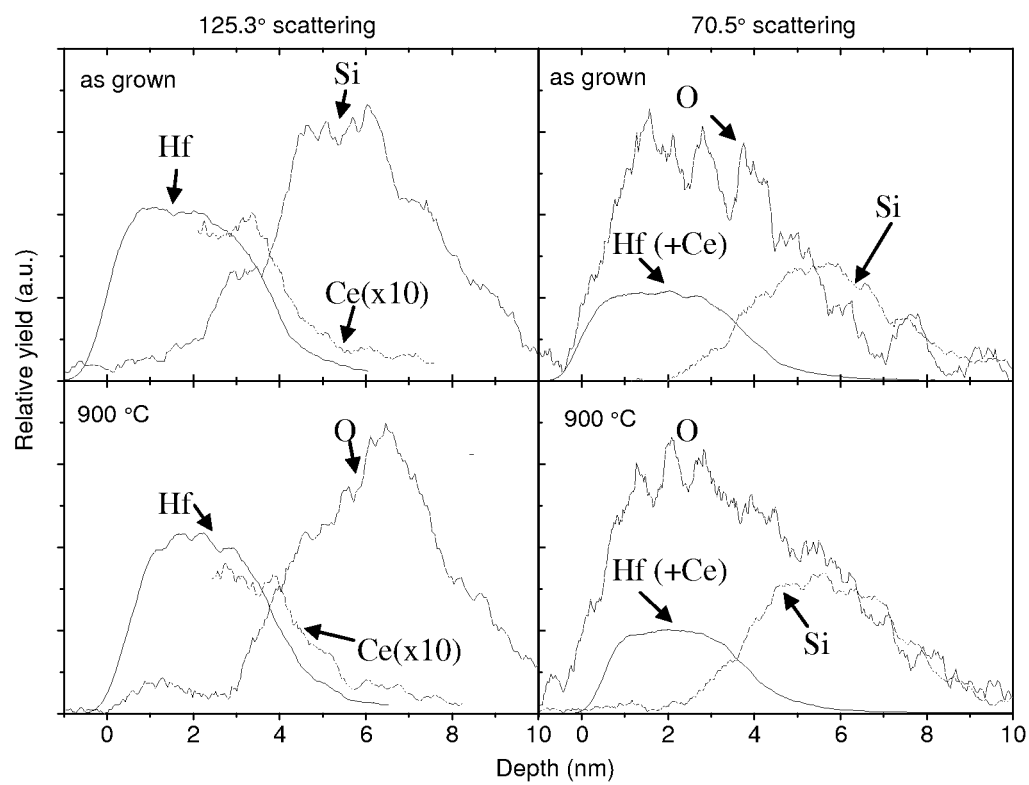
FIG. 11C is MEIS depth profiles demonstrating Relative Yield (a.u.) versus Depth (nm) for 1:9 Ce:Hf ratio film.

FIG. 11C is shows the MEIS energy spectrum of 10% Ce-doped HfO$_2$ annealing in vacuum using 1:9 ratio of Ce:Hf.

Figure 12:
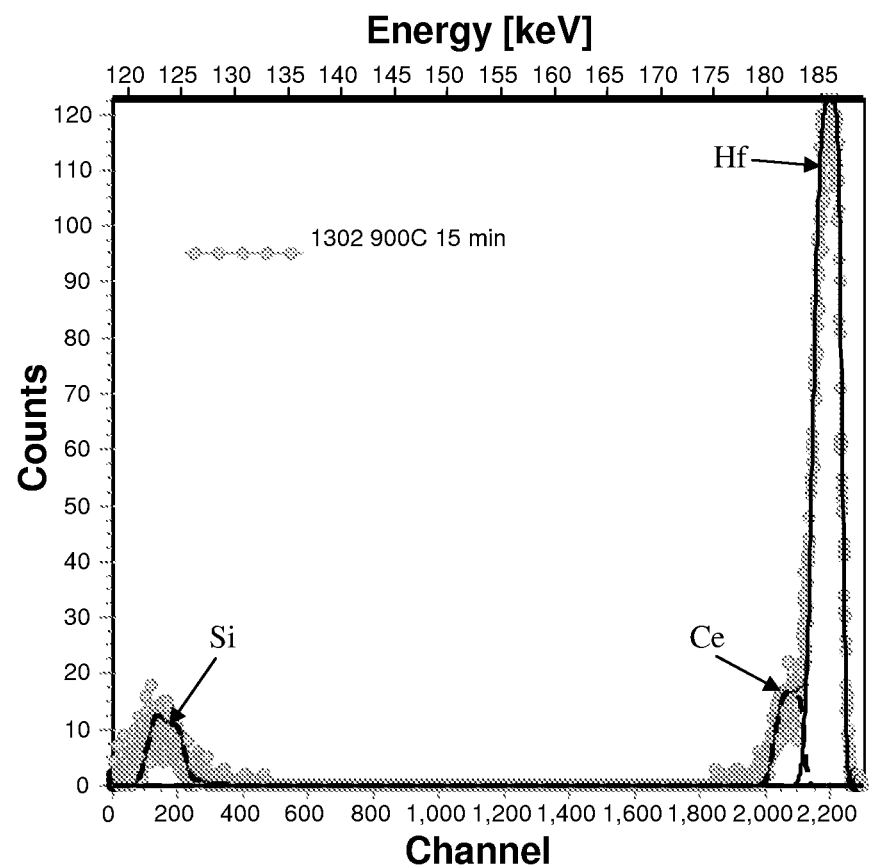
FIG. 12 is a SIMNRA model demonstrating Energy (keV) versus Counts versus Channel for Sample 1302.
Figure 13:
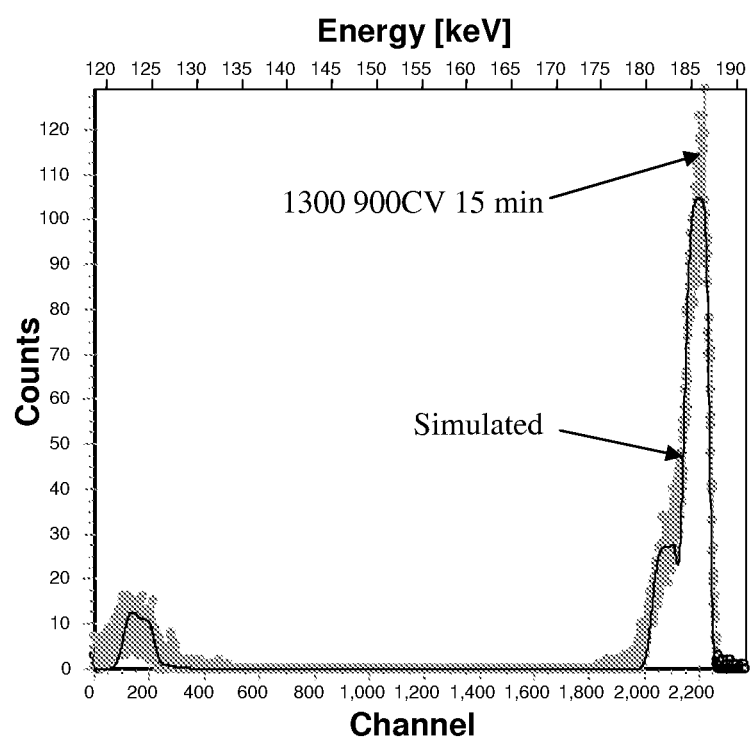
FIG. 13 is a SIMNRA model demonstrating Energy (keV) versus Counts versus Channel for Sample 1300.
Figure 14:
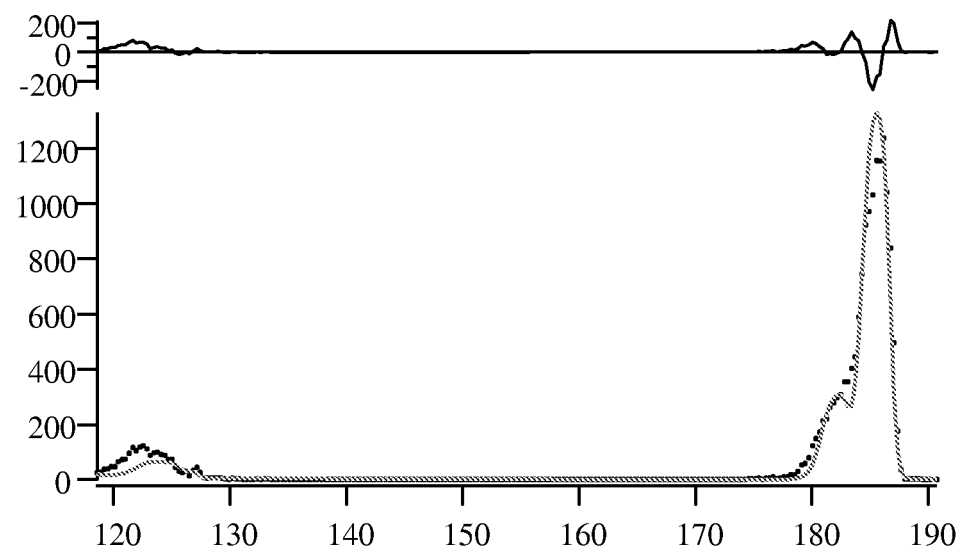
FIG. 14 is an Igor model demonstrating Energy (keV) versus Counts.

Pictures from SIMNRA and Igor models are represented in FIGS. 12-14. SIMNRA. SIMNRA is a Microsoft Windows program for the simulation of backscattering spectra for ion beam analysis with MeV ions.

FIG. 12 is a SIMNRA model demonstrating Energy (keV) versus Counts versus Channel for Sample 1302, 900° C., 15 min annealing. Sample 1302 is represented by the line with circular points.

FIG. 13 is a SIMNRA model demonstrating Energy (keV) versus Counts versus Channel for Sample 1300, 900° C., 15 min annealing. Sample 1300 is represented by the line with circular points.

FIG. 14 is an Igor model demonstrating Energy (keV) versus Counts.

Example 8

AFM Data

AFM was carried out to look for pinholing which could cause a Si surface peak in the annealed samples.

Figure 15:
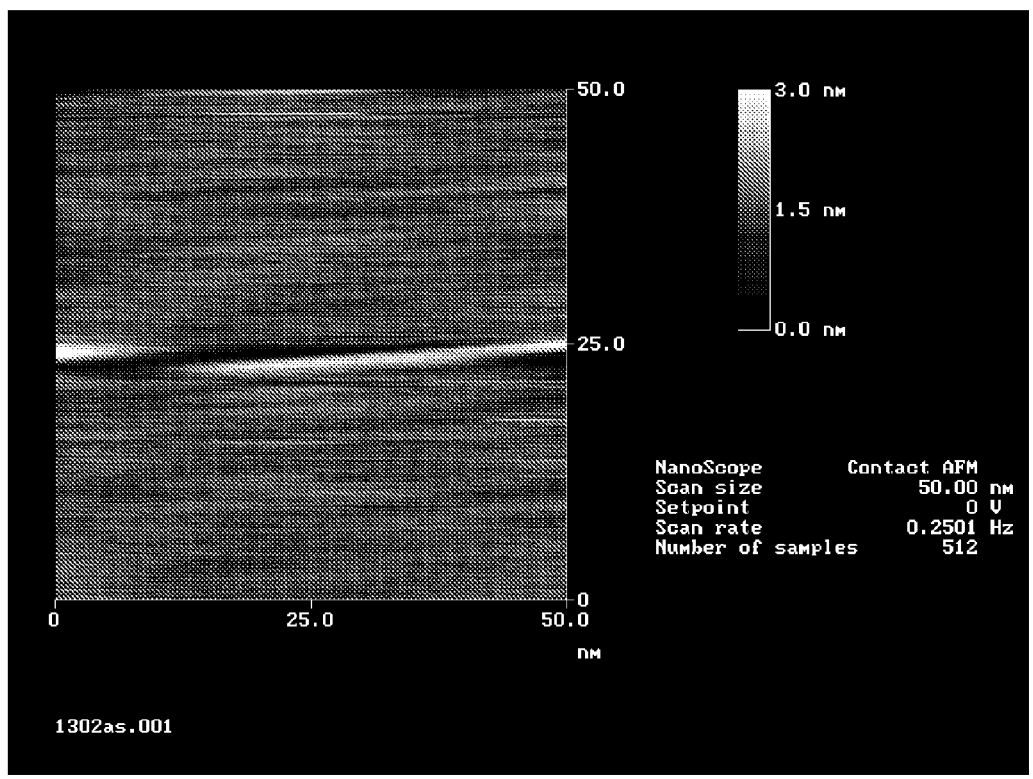
FIG. 15 is an Atomic Force Microscopy (AFM) image for Sample 1302 as grown.

FIG. 15 is an Atomic Force Microscopy (AFM) image for Sample 1302 as grown.

Figure 16:
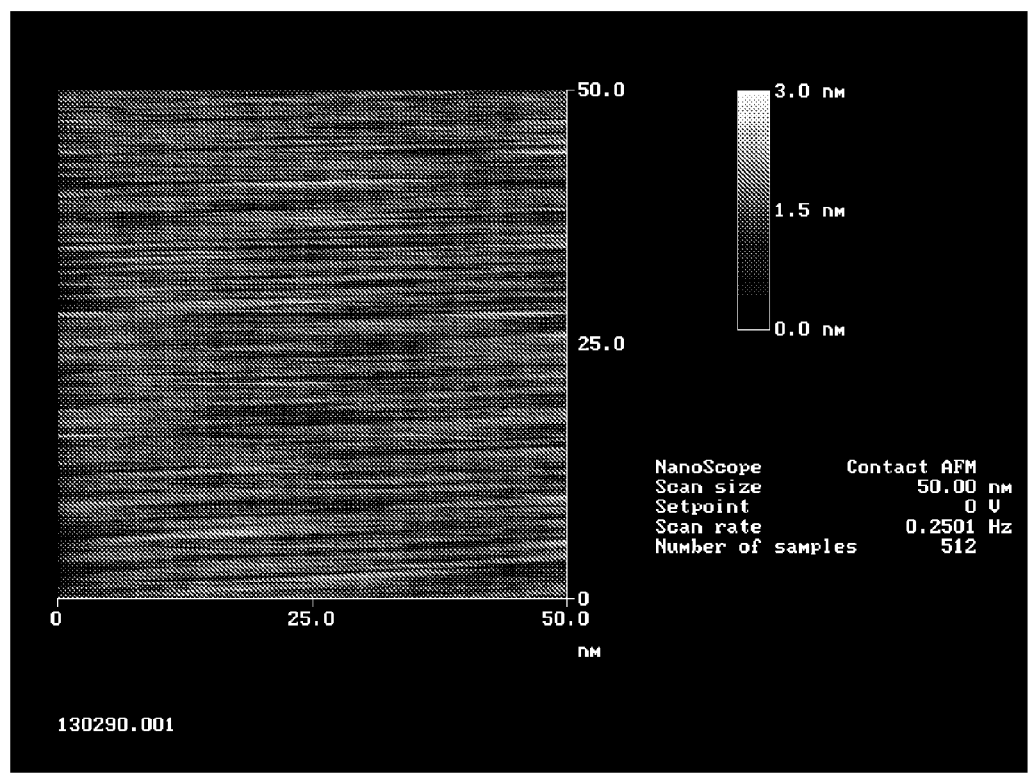
FIG. 16 is an AFM image for Sample 1302, 900° C., 15 min., $N_2$ anneal.

FIG. 16 is an Atomic Force Microscopy (AFM) image for Sample 1302, 900° C., 15 min., N$_2$ anneal.

Figure 17:
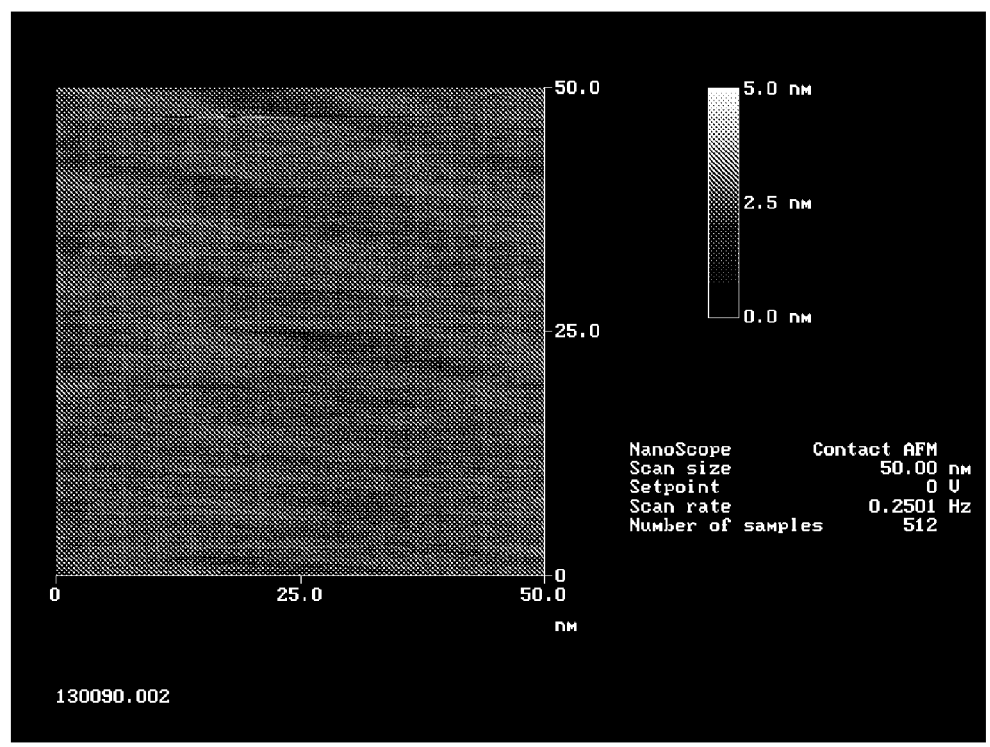
FIGS. 17 and 18 are an AFM image for Sample 1300, 900° C., 15 min., $N_2$ anneal.
Figure 18:
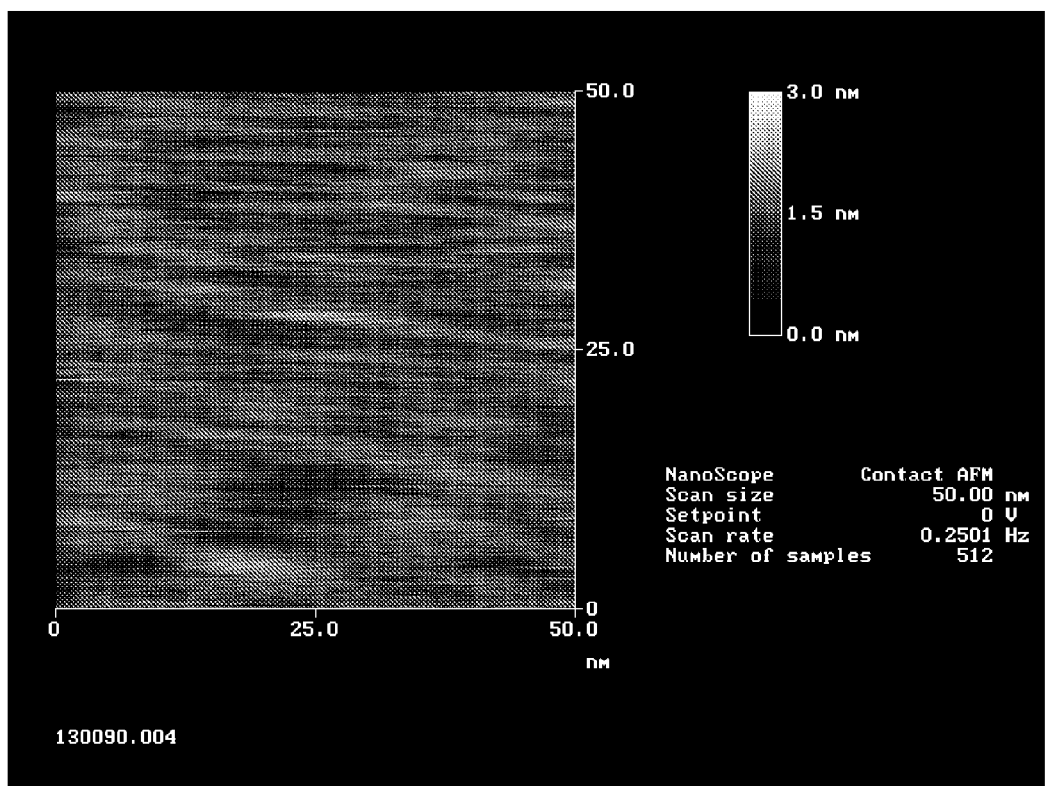

FIGS. 17 and 18 are an Atomic Force Microscopy (AFM) image for Sample 1300, 900° C., 15 min., N$_2$ anneal. The results show that good morphology can be obtained.

Example 9

Cerium-Doped Zirconium Oxide Film by ALD

Second, ALD growth experiments were carried out whereby Ce was doped into ZrO$_2$ at 10% and 15%, using the parameters listed above. The cerium precursor used was Ce(THD)$_4$. The zirconium precursor used was (MeCp)$_2$Zr(OMe)Me.

Figure 19:
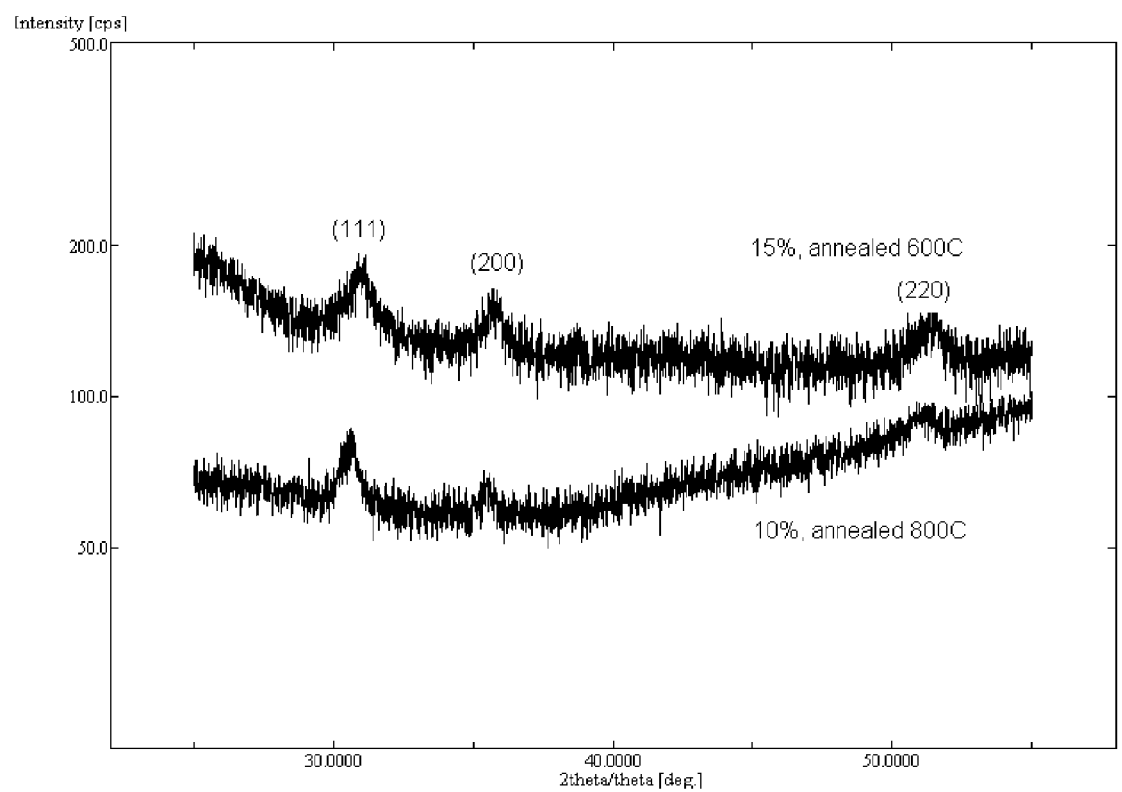
FIG. 19 is a graphical representation of XRD Spectroscopy of two deposited layers of $Ce(THD)_4$ doped $ZrO_2$ where the Ce level was 10% and 15%.

FIG. 19 represents XRD spectroscopy of two deposited layers of Ce(THD)$_4$ doped ZrO$_2$ where the Ce level was 10% and 15%. The detected peaks have been assigned as marked and these XRD reflections indicate that the films are cubic/tetragonal. Therefore, it can be concluded that the Ce addition in the ZrO$_2$ has stabilized these metastable phases which was the objective as they are the higher k phases.

All patents and publications cited herein are incorporated by reference into this application in their entirety.

The words "comprise", "comprises", and "comprising" are to be interpreted inclusively rather than exclusively.

What is claimed is:

1. A method to form a cerium-doped high-κ dielectric film by a chemical phase deposition process, the method comprising delivering at least one metal-source precursor and at least one cerium precursor to a substrate, wherein the at least one cerium precursor corresponds in structure to Formula I:

(Formula I)

wherein:

L is a β-diketonate; or L is a moiety selected from the group consisting of hexafluoroisopropoxide, 2-dimethylaminoethanolate, 2-methoxyethanolate and 1-methoxy-2-methyl-2-propanolate; and x is 4; wherein the high-κ dielectric film comprises hafnium oxide; zirconium oxide; titanium oxide; or a mixture of hafnium oxide, zirconium oxide and/or titanium oxide.

2. The method of claim 1, wherein L is a β-diketonate independently selected from the group consisting of 2,2,6,6-tetramethyl-3,5-heptanedionate, pentane-2,4-dionate and 1,1,1,5,5,5-hexafluoropentane-2,4-dionate; or L is 1-methoxy-2-methyl-2-propanolate.

3. The method of claim 1, wherein the at least one cerium precursor is Ce(thd)$_4$ or Ce(mmp)$_4$.

4. The method of claim 1, wherein the high-K dielectric film comprising hafnium oxide, zirconium oxide, titanium oxide or mixture thereof contains from about 0.5 to about 35 atomic metal % cerium.

5. The method of claim 4, wherein the high-κ dielectric film comprising hafnium oxide, zirconium oxide, titanium oxide or mixture thereof contains from about 5 to about 20 atomic metal % cerium.

6. The method of claim 4, wherein the high-κ dielectric film comprising hafnium oxide, zirconium oxide, titanium oxide or mixture thereof contains from about 8 to about 12 atomic metal % cerium.

7. The method of claim 1, wherein the chemical phase deposition process is chemical vapor deposition.

8. The method of claim 7, wherein the chemical vapor deposition is liquid injection chemical vapor deposition.

9. The method of claim 1, wherein the chemical phase deposition process is atomic layer deposition.

10. The method of claim 9, wherein the atomic layer deposition is photo-assisted atomic layer deposition.

11. The method of claim 9, wherein the atomic layer deposition is liquid injection atomic layer deposition.

12. The method of claim 1, wherein the at least one cerium precursor is dissolved in an organic solvent.

13. The method of claim 12, wherein the organic solvent is selected from the group consisting of toluene, heptane, octane, nonane and tetrahydrofuran.

14. The method of claim 1, wherein each precursor is deposited onto the substrate in pulses alternating with pulses of an oxygen source.

15. The method of claim 14, wherein the oxygen source is H$_2$O, O$_2$ or ozone.

16. The method of claim 1, wherein each precursor is deposited onto the substrate in pulses with a continuous supply of the oxygen source.

17. The method of claim 16, wherein the oxygen source is H$_2$O, O$_2$ or ozone.

18. The method of claim 1, wherein the at least one metal-source precursor is compatible with the cerium precursor.

19. The method of claim 1, wherein the at least one metal-source precursor is selected from the group consisting of a metal amide selected from the group consisting of hafnium dimethylamide, zirconium dimethylamide, titanium dimethylamide, hafnium ethylmethylamide, zirconium ethylmethylamide, titanium ethylmethylamide, hafnium diethylamide, zirconium diethylamide and titanium diethylamide;

a metal alkoxide selected from the group consisting of hafnium t-butoxide, zirconium t-butoxide, titanium t-butoxide, hafnium i-propoxide, zirconium i-propoxide, titanium i-propoxide, hafnium bis t-butoxy bis 2-methyl-2-methoxy propoxide, zirconium bis t-butoxy bis 2-methyl-2-methoxy propoxide, titanium bis t-butoxy bis 2-methyl-2-methoxy propoxide, zirconium bis i-propoxy bis 2-methyl-2-methoxy propoxide, titanium bis i-propoxy bis 2-methyl-2-methoxy propoxide, hafnium 2-methyl-2-methoxy propoxide, zirconium 2-methyl-2-methoxy propoxide and titanium 2-methyl-2-methoxy propoxide;

a metal β-diketonate selected from the group consisting of hafnium 2,2,6,6-tetramethyl-3,5-heptanedionate, zirconium 2,2,6,6-tetramethyl-3,5-heptanedionate, titanium 2,2,6,6-tetramethyl-3,5-heptanedionate, zirconium bis i-propoxy bis 2,2,6,6-tetramethyl-3,5-heptanedionate and titanium bis i-propoxy 2,2,6,6-tetramethyl-3,5-heptanedionate;

a metal cyclopentadienyl selected from the group consisting of bis methylcyclopentadienyl hafnium dimethyl, bis methylcyclopentadienyl zirconium dimethyl, bis methylcyclopentadienyl hafnium methyl methoxide, bis methylcyclopentadienyl zirconium methyl methoxide, methylcyclopentadienyl hafnium tris dimethylamide, methylcyclopentadienyl zirconium tris dimethylamide and methylcyclopentadienyl titanium tris dimethylamide.

20. The method of claim 1, wherein the high-K dielectric film has a relative permittivity of about 20 to about 100.

21. The method of claim 1, wherein the high-K dielectric film can maintain a relative permittivity of about 20 to about 100 at frequencies of about 1 KHz to about 1 GHz.

22. The method of claim 1, wherein the high-K dielectric film is used for a memory and/or logic application.

23. The method of claim 1, wherein Ce(IV) in the at least one cerium precursor is incorporated into the crystal lattice of the high-K dielectric film without forming oxygen vacancies.

24. The method of claim 1, wherein Ce(IV) in the at least one cerium precursor is substitutionally part of the lattice or part of the lattice as an interstitial inclusion.

25. The method of claim 1, wherein the least one cerium precursor is Ce(mmp)$_4$.

26. A method to improve high-K gate property of a semiconductor device, the method comprising using at least one cerium precursor to form a cerium-doped high-κ dielectric film for use in the semiconductor device, wherein the at least one cerium precursor corresponds in structure to Formula I:

$$Ce(L)_x \quad \text{(Formula I)}$$

wherein:

L is a β-diketonate; or L is a moiety selected from the group consisting of hexafluoroisopropoxide, 2-dimethylaminoethanolate, 2-methoxyethanolate and 1-methoxy-2-methyl-2-propanolate; and x is 4; wherein the high-κ dielectric film comprises hafnium oxide; zirconium oxide; titanium oxide; or a mixture of hafnium oxide, zirconium oxide and/or titanium oxide.

27. The method of claim 26, wherein L is a β-diketonate independently selected from the group consisting of 2,2,6,6-tetramethyl-3,5-heptanedionate, pentane-2,4-dionate and 1,1,1,5,5,5-hexafluoropentane-2,4-dionate; or L is 1-methoxy-2-methyl-2-propanolate.

28. The method of claim 26, wherein the high-K dielectric film has a relative permittivity of about 20 to about 100.

29. The method of claim 26, wherein the high-K dielectric film can maintain a relative permittivity of about 20 to about 100 at frequencies of about 1 KHz to about 1 GHz.

30. The method of claim 26, wherein the high-K dielectric film is formed by chemical vapor deposition or atomic layer deposition.

31. A method to stabilize a high-K dielectric film, the method comprising adding at least one cerium precursor to form a cerium-doped high-K dielectric film wherein the at least one cerium precursor corresponds in structure to Formula I:

$$Ce(L)_x \quad \text{(Formula I)}$$

wherein:

L is a β-diketonate; or L is a moiety selected from the group consisting of hexafluoroisopropoxide, 2-dimethylaminoethanolate, 2-methoxyethanolate and 1-methoxy-2-methyl-2-propanolate; and x is 4; wherein the high-κ dielectric film comprises hafnium oxide; zirconium oxide; titanium oxide; or a mixture of hafnium oxide, zirconium oxide and/or titanium oxide.

32. The method of claim 31, wherein to stabilize the high-K dielectric film a hafnium oxide, zirconium oxide or titanium oxide metastable phase is maintained.

33. The method of claim 31, wherein stabilization of a hafnium oxide, zirconium oxide, titanium oxide or mixture thereof film results in a relative permittivity of about 20 to about 100.

34. The method of claim 31, wherein stabilization of a hafnium oxide, zirconium oxide, titanium oxide or mixture thereof film results in a relative permittivity of about 25 to about 100 at frequencies of about 1 KHz to about 1 GHz.

35. The method of claim 31, wherein the stabilized high-K dielectric film is used in a semiconductor device.

* * * * *

UNITED STATES PATENT AND TRADEMARK OFFICE
CERTIFICATE OF CORRECTION

PATENT NO.        : 8,613,975 B2
APPLICATION NO.   : 12/992936
DATED             : December 24, 2013
INVENTOR(S)       : Paul Raymond Chalker and Peter Nicholas Heys It is certified that error appears in the above-identified patent and that said Letters Patent is hereby corrected as shown below:

In the Specification

Column 13, line 11, replace "2.4" with --2.5--.
Column 13, line 41, replace "MUM" with --SRIM--.
Column 13, line 42, replace "$Ce_{0.25}Hf_{0.5}O_2$" with --$Ce_{0.25}Hf_{0.75}O_2$--.

In the Claims

Column 16, line 12, claim 4, replace "K" with --κ--.
Column 17, line 20, claim 20, replace "K" with --κ--.
Column 17, line 22, claim 21, replace "K" with --κ--.
Column 17, line 25, claim 22, replace "K" with --κ--.
Column 17, line 29, claim 23, replace "K" with --κ--.
Column 17, line 35, claim 26, replace "K" with --κ--.
Column 18, line 10, claim 28, replace "K" with --κ--.
Column 18, line 12, claim 29, replace "K" with --κ--.
Column 18, line 15, claim 30, replace "K" with --κ--.
Column 18, line 18, claim 31, replace "K" with --κ--.
Column 18, line 20, claim 31, replace "K" with --κ--.
Column 18, line 33, claim 32, replace "K" with --κ--.
Column 18, line 44, claim 35, replace "K" with --κ--.

Signed and Sealed this
Twelfth Day of May, 2015

Michelle K. Lee
*Director of the United States Patent and Trademark Office*